(12) United States Patent
Kumar et al.

(10) Patent No.: US 7,523,545 B2
(45) Date of Patent: Apr. 28, 2009

(54) METHODS OF MANUFACTURING PRINTED CIRCUIT BOARDS WITH STACKED MICRO VIAS

(75) Inventors: Raj Kumar, Mission Viejo, CA (US); Monte Dreyer, Rancho Santa Margarita, CA (US); Michael J. Taylor, Longmont, CO (US)

(73) Assignee: Dynamic Details, Inc., Anaheim, CA (US)

( * ) Notice: Subject to any disclaimer, the term of this patent is extended or adjusted under 35 U.S.C. 154(b) by 80 days.

(21) Appl. No.: 11/706,473

(22) Filed: Feb. 14, 2007

(65) Prior Publication Data

US 2007/0246254 A1   Oct. 25, 2007

Related U.S. Application Data

(60) Provisional application No. 60/793,370, filed on Apr. 19, 2006.

(51) Int. Cl.
    *H05K 3/36*       (2006.01)
(52) U.S. Cl. .............................. 29/830; 29/846; 29/852; 174/255; 361/792
(58) Field of Classification Search ........... 29/829–830, 29/846–852; 174/255, 262, 264, 269; 361/792–795, 361/760–762; 216/17, 22; 156/307.7
See application file for complete search history.

(56) References Cited

U.S. PATENT DOCUMENTS

| | | | | |
|---|---|---|---|---|
| 6,000,129 A | * | 12/1999 | Bhatt et al. | 29/852 |
| 6,440,542 B1 | * | 8/2002 | Kariya | 174/259 |
| 6,555,761 B2 | * | 4/2003 | Amir | 174/263 |
| 6,631,558 B2 | * | 10/2003 | Burgess | 29/852 |
| 6,779,262 B1 | * | 8/2004 | Gales et al. | 29/852 |
| 6,954,986 B2 | * | 10/2005 | Schmidt | 29/852 |
| 7,260,890 B2 | * | 8/2007 | White et al. | 29/830 |
| 7,402,758 B2 | * | 7/2008 | Mattix | 174/262 |
| 2007/0246254 A1 | * | 10/2007 | Kumar et al. | 174/264 |

* cited by examiner

*Primary Examiner*—Minh Trinh
(74) *Attorney, Agent, or Firm*—Christie, Parker & Hale, LLP

(57) ABSTRACT

Methods of manufacturing printed circuit boards having circuit layers laminated with stacked (or staggered) micro via(s). Aspects of embodiments of the present invention are directed to a method of manufacturing a printed circuit board with Z-axis interconnect(s) or micro via(s) that can eliminate a need for plating micro vias and/or eliminate a need for planarizing plated bumps of a surface, that can be fabricated with one or two lamination cycles, and/or that can have carrier-to-carrier (or substrate-to-substrate) attachments with conductive vias, each filled with a conductive material (e.g., with a conductive paste) in the Z-axis. In one embodiment, a printed circuit board having a plurality of circuit layers with at least one z-axis interconnect can be fabricated using a single lamination cycle.

21 Claims, 16 Drawing Sheets

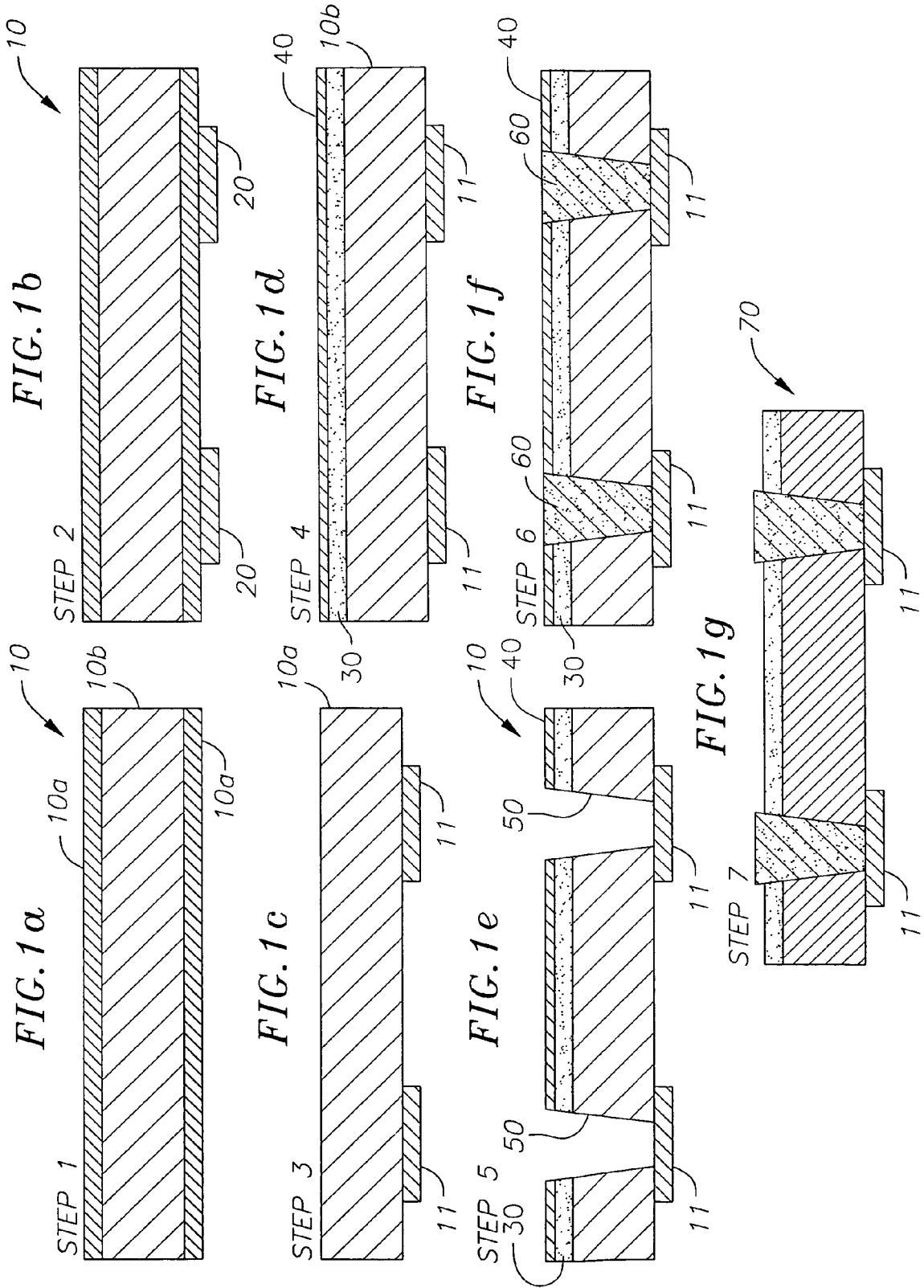

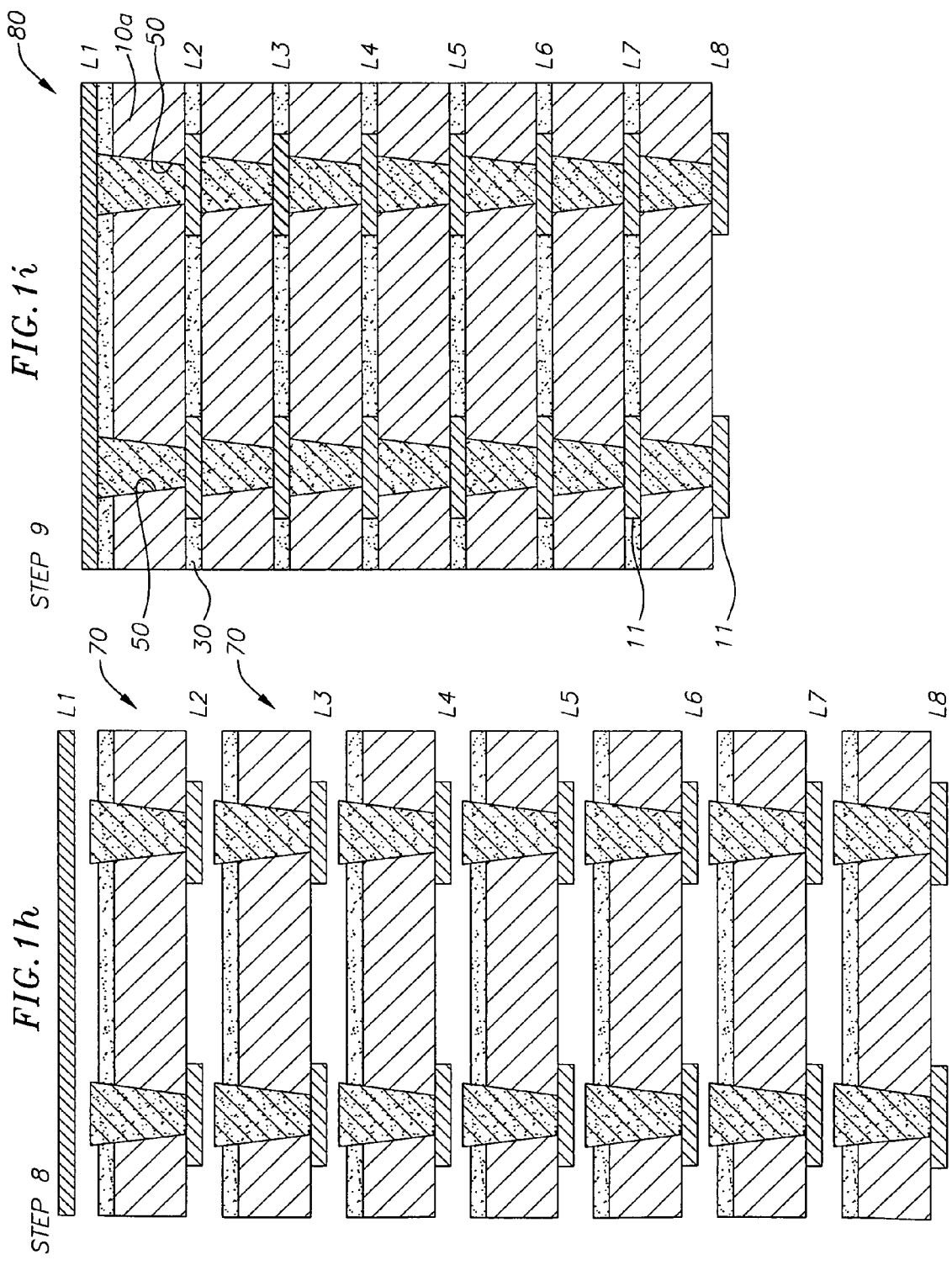

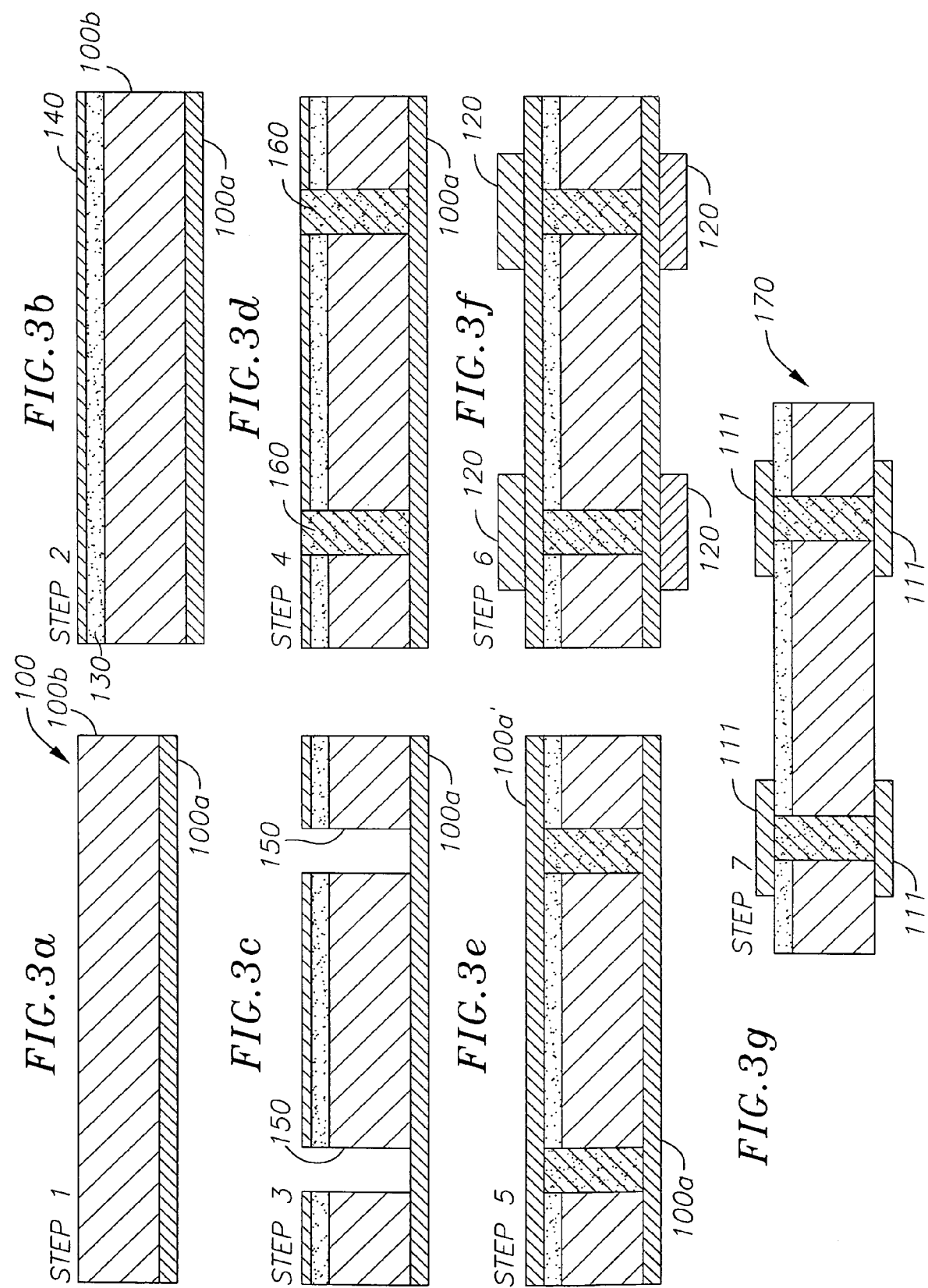

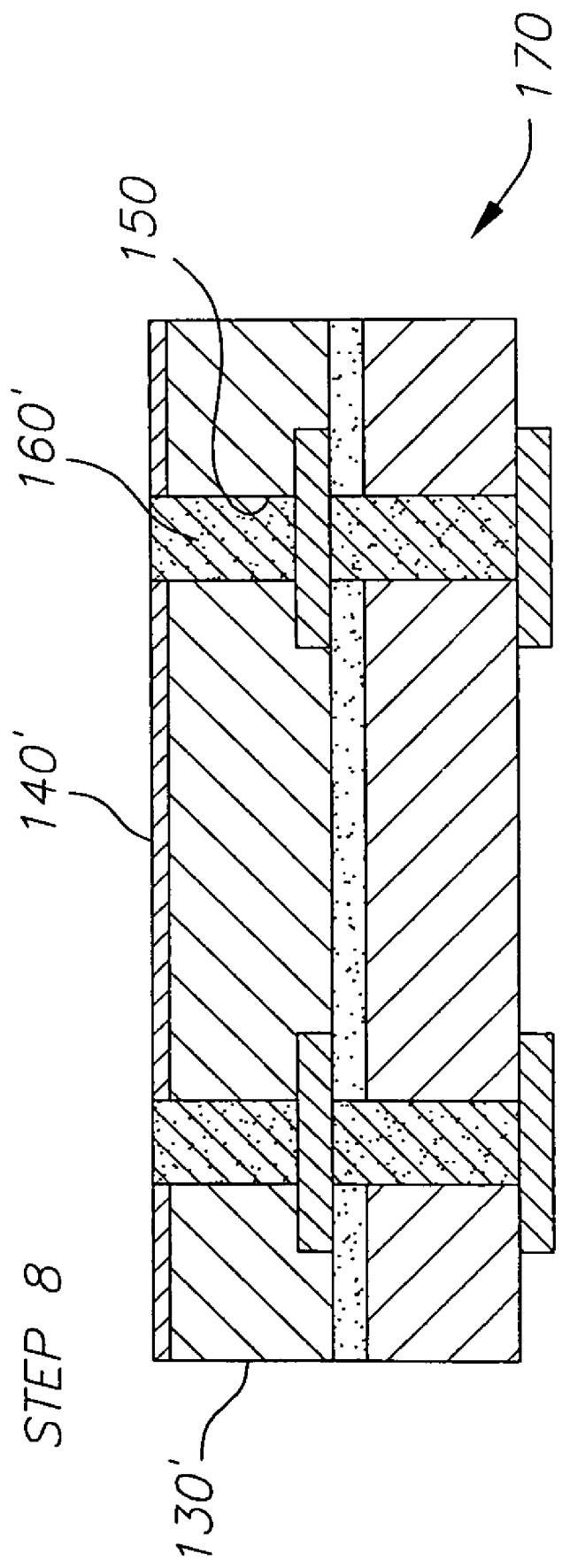

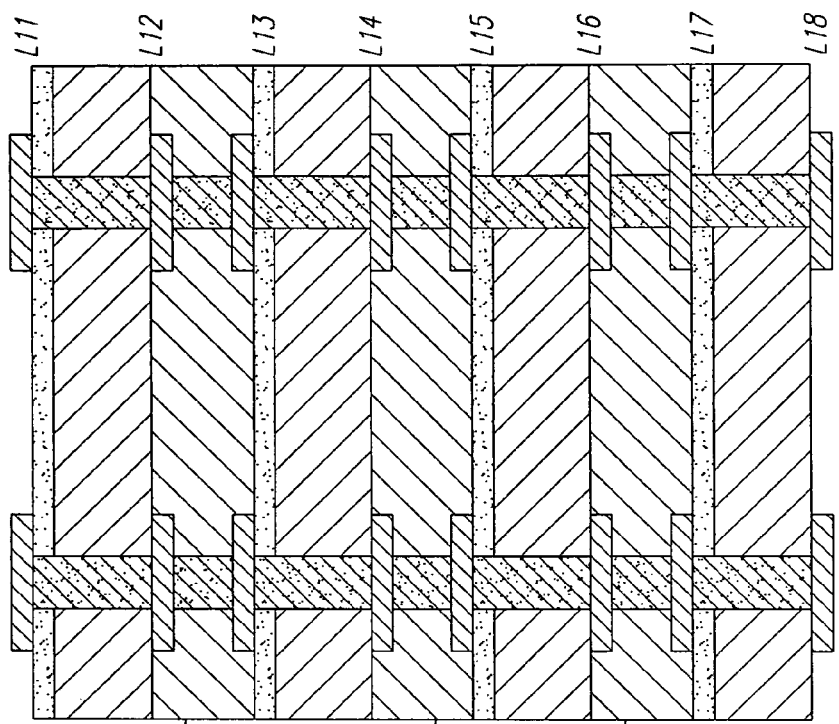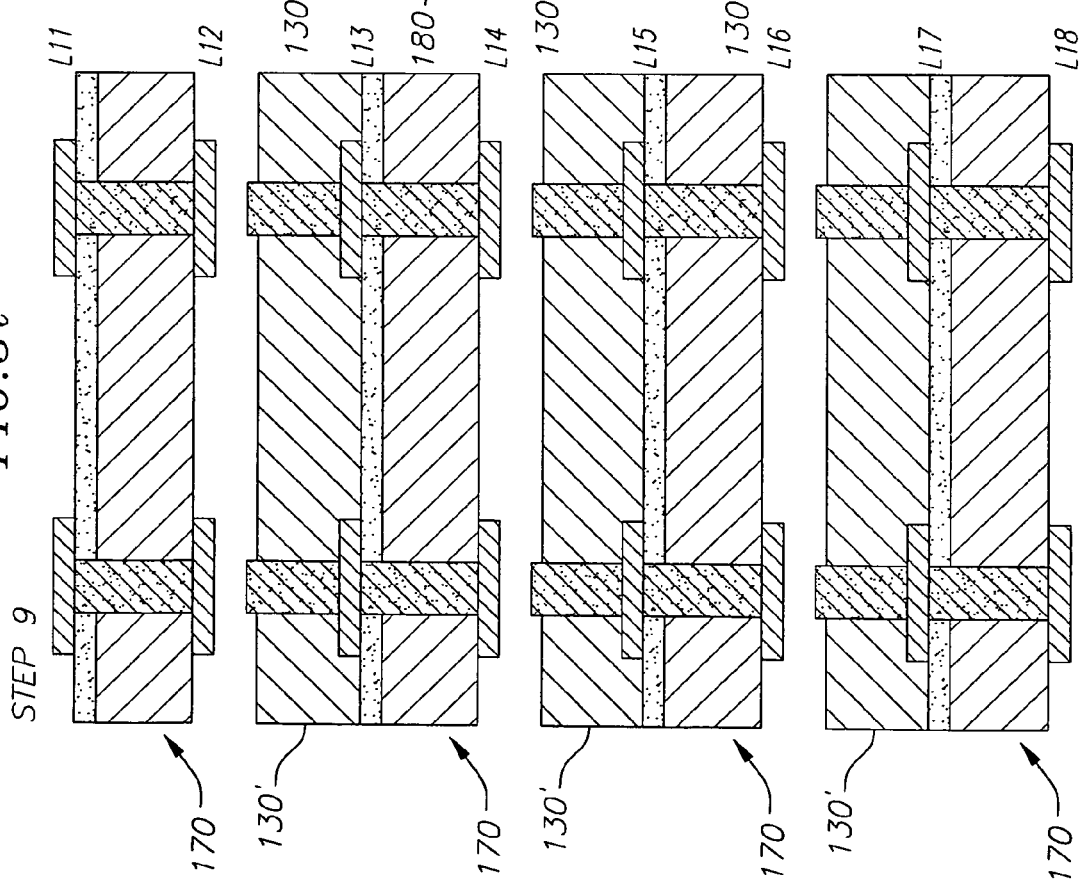

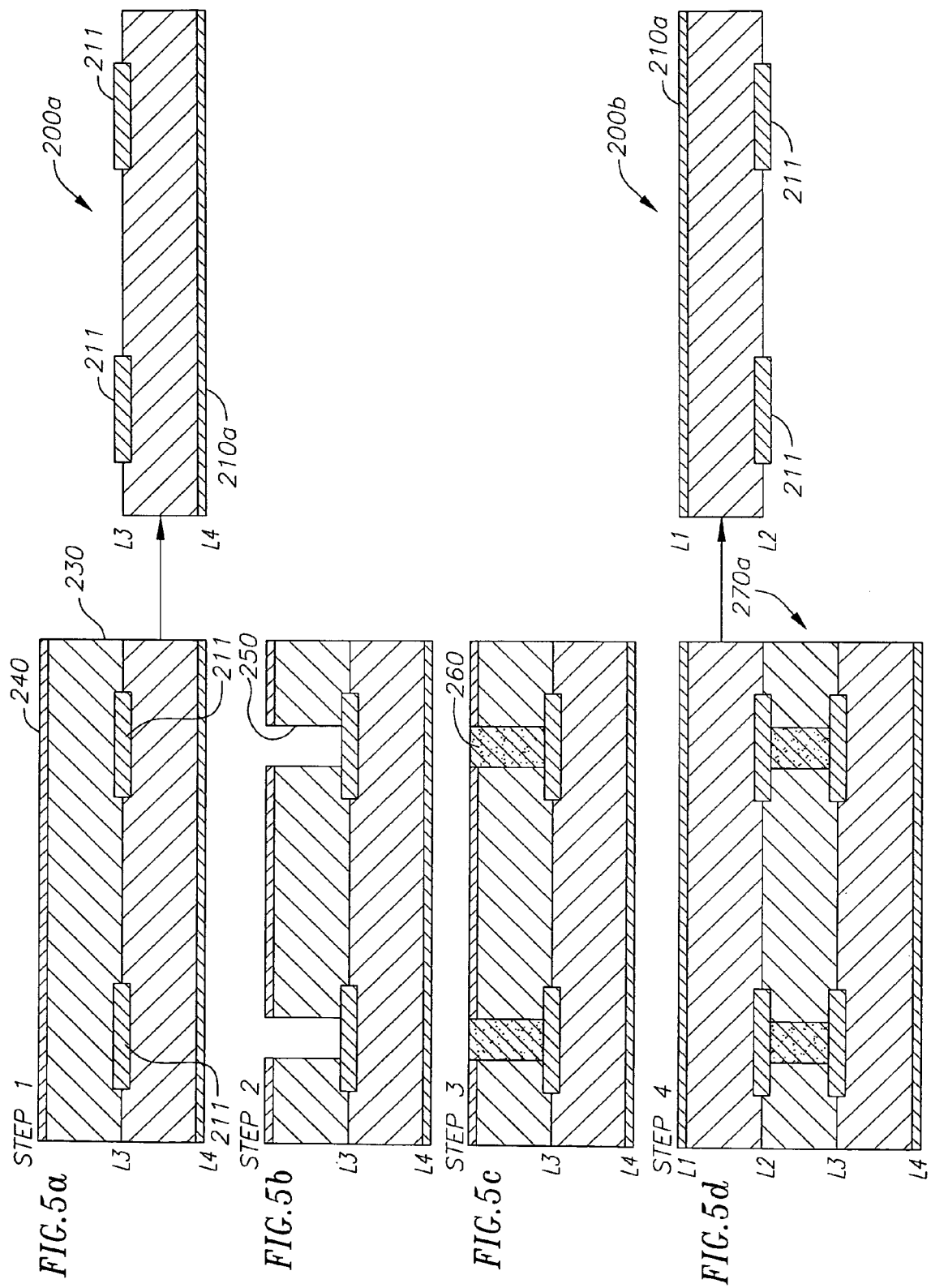

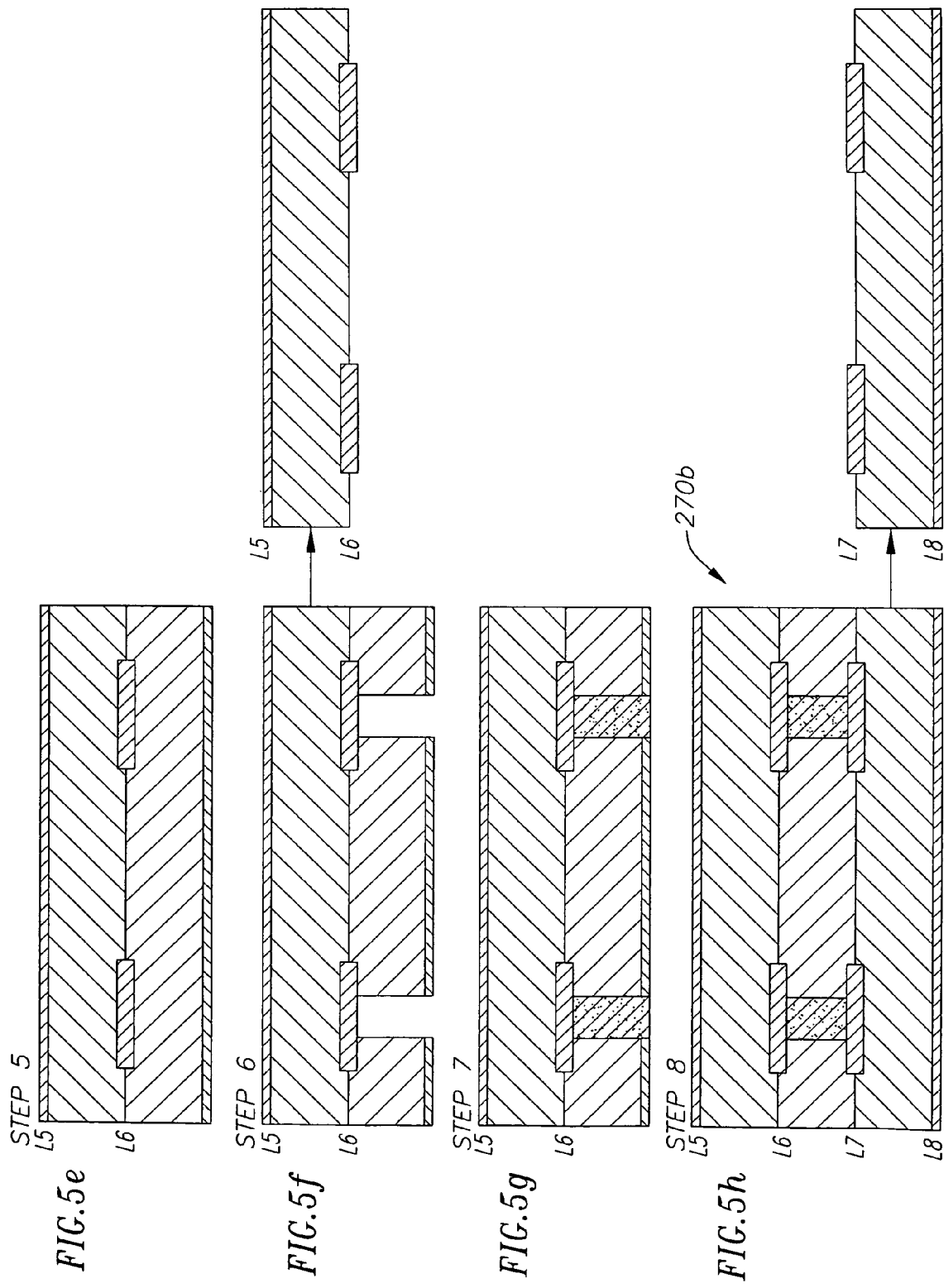

STEP 1

STEP 2

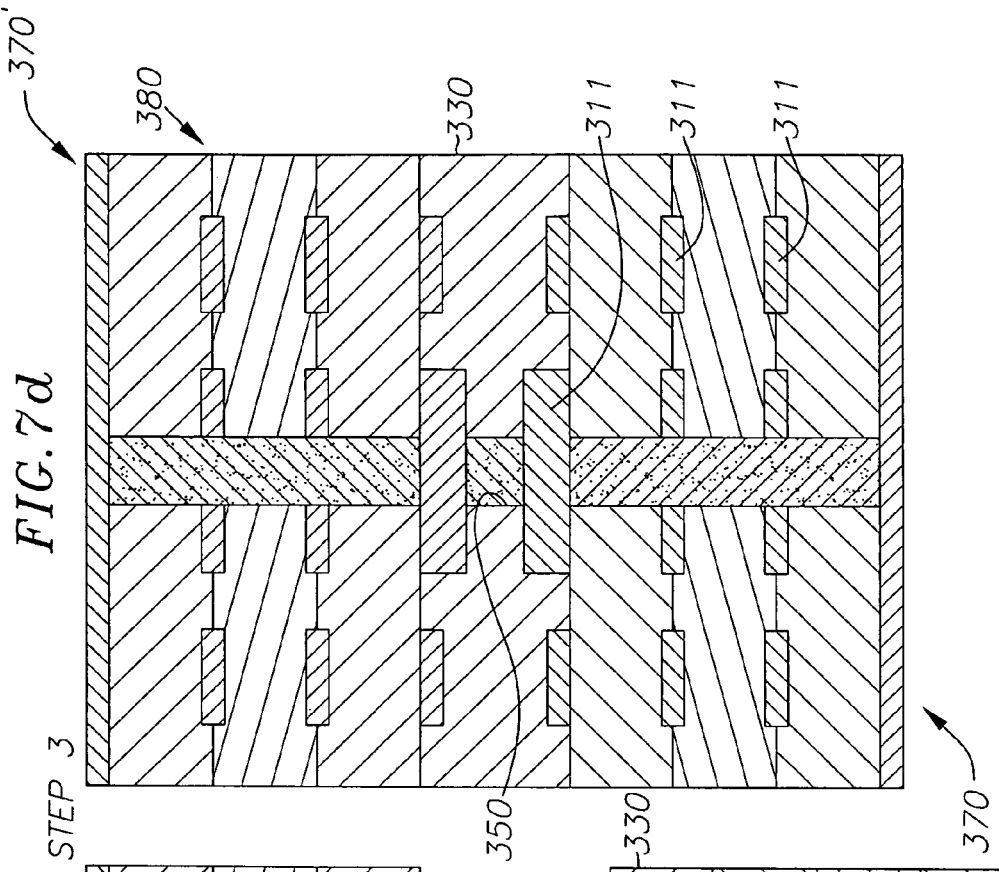
FIG. 7d
STEP 3
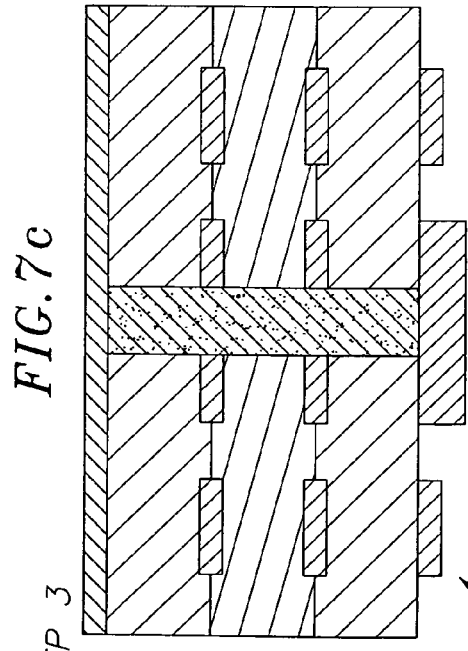
FIG. 7c
STEP 3
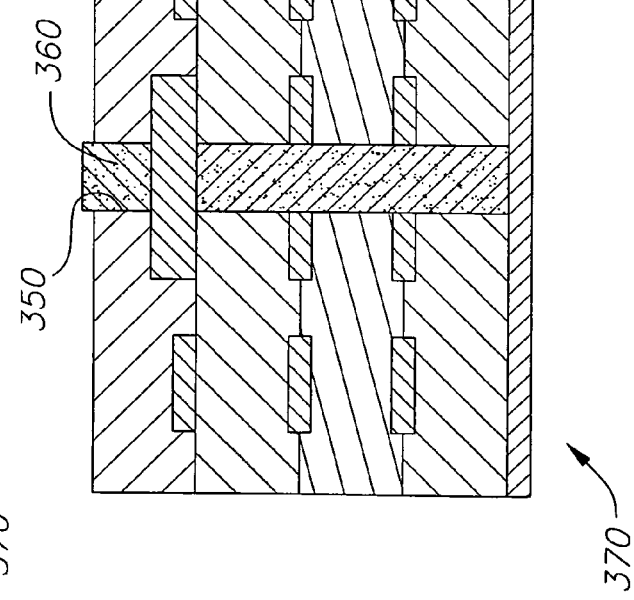

METHODS OF MANUFACTURING PRINTED CIRCUIT BOARDS WITH STACKED MICRO VIAS

CROSS-REFERENCE TO RELATED APPLICATION(S)

This application claims priority to and the benefit of U.S. Provisional Application No. 60/793,370, filed on Apr. 19, 2006, the entire content of which is incorporated herein by reference.

FIELD OF THE INVENTION

The present invention relates generally to printed circuit boards and methods of manufacturing the same, and more particularly, to printed circuit boards having circuit layers laminated with stacked (or staggered) micro via(s) and methods of manufacturing the same.

BACKGROUND

Most electronic systems include printed circuit boards with high density electronic interconnections. A printed circuit board may include one or more circuit cores, substrates, or carriers. In one fabrication scheme for the printed circuit board having the one or more circuit carriers, electronic circuitries (e.g., pads, electronic interconnects, etc.) are fabricated onto opposite sides of an individual circuit carrier to form a pair of circuit layers. These circuit layer pairs of the circuit board may then be physically and electronically joined to form the printed circuit board by fabricating an adhesive (or a prepreg or a bond ply), stacking the circuit layer pairs and the adhesives in a press, curing the resulting circuit board structure, drilling or laser drilling through-holes, and then plating the through-holes with a copper material to interconnect the circuit layer pairs. The curing process is used to cure the adhesives to provide for permanent physical bonding of the circuit board structure. However, the adhesives generally shrink significantly during the curing process. The shrinkage combined with the later through-hole drilling and plating processes can cause considerable stress into the overall structure, leading to damage or unreliable interconnection or bonding between the circuit layers. Thus, there is a need for material and associated processes which can compensate for this shrinkage and can provide for stress-free and reliable electronic interconnection between the circuit layer pairs.

In addition, the plating of the through-holes (or vias) with the copper material requires an additional, expensive, and time consuming process sequence that is difficult to implement with a quick turnaround. Thus, there is a need to provide for a printed circuit board and a method of manufacturing the same that can be quickly and easily assembled and/or ensure alignment of the interconnections (or through-holes or micro vias) on the printed circuit board during the assembly process to thereby reduce assembly costs.

SUMMARY

Aspects of embodiments of the present invention are directed to a printed circuit board with Z-axis interconnect(s) or micro via(s) that can eliminate a need for plating micro vias and/or eliminate a need for planarizing plated bumps of a surface, that can be fabricated with one or two lamination cycles, and/or that can have carrier-to-carrier (or substrate-to-substrate) attachments with conductive vias, each filled with a conductive material (e.g., with a conductive paste) in the Z-axis.

In one exemplary embodiment of the present invention, a printed circuit board includes a plurality of circuit layers. Each of the circuit layers of the printed circuit board is formed with one or more copper foil pads. A core material is interposed between one and a corresponding one of the circuit layers. The core material includes one or more micro vias each having a conductive paste filled therein. The conductive pastes electrically interconnect the conductive copper foil pads throughout the circuit layers.

In one exemplary embodiment of the present invention, a printed circuit board includes a plurality of circuit layers. Each of the circuit layers of the printed circuit board is formed with one or more copper foil pads. A core material is interposed between one and a corresponding one of the circuit layers, or a lamination adhesive is interposed between one and a corresponding one of the circuit layers. The core material includes one or more micro vias each having a conductive paste filled therein, and the lamination adhesive includes one or more micro vias each having a conductive paste filled therein. The micro vias of the lamination adhesive correspond with the respective micro vias of the core material. The conductive pastes electrically interconnect the conductive copper foil pads throughout the circuit layers.

In one exemplary embodiment of the present invention, a printed circuit board includes a plurality of circuit layers. Each of the circuit layers of the printed circuit board is formed with one or more copper foil pads or with one or more micro via plates. A core material or a lamination prepreg is interposed between one and a corresponding one of the circuit layers. The core material is formed to have one or more extended portions of the micro via plates extended therein. The lamination prepreg includes one or more micro vias each having a conductive paste filled therein. Here, the conductive pastes and the extended portions of the micro via plates electrically interconnect the conductive copper foil pads and the micro via plates throughout the circuit layers.

In one exemplary embodiment of the present invention, a printed circuit board includes a plurality of circuit layers (e.g., eight circuit layers). Here, the conductive paste electrically interconnects at least one of a plurality of copper foil pads (e.g., three copper foil pads) located on a side of a four-layer substrate to at least one of a plurality of copper foil pads (e.g., three copper foil pads) located on a side of another four-layer substrate.

An embodiment of the present invention provides a method of manufacturing a printed circuit board having a plurality of circuit layers with at least one z-axis interconnect using a single lamination cycle. The method includes attaching a plurality of one-metal layer carriers with each other after parallel processing each of the plurality of one-metal layer carriers. Here, the parallel processing of at least one of the plurality of one-metal layer carriers includes: imaging at least one photo resist onto a substrate having at least one copper foil formed on at least one side of the substrate; etching off the at least one copper foil from the substrate with exception of at least one part of the at least one copper foil covered by the at least one photo resist; stripping off the at least one photo resist to expose the at least one part of the at least one copper foil to form at least one copper foil pad for one of the plurality of circuit layers; applying a lamination adhesive on the substrate; applying a protective film on the lamination adhesive; forming at least one micro via into the substrate to expose the at least one copper foil pad at a side of the substrate opposite to the at least one side of the substrate; filling at least one conductive paste into the at least one micro via formed in the substrate; and removing the protective film to expose the lamination adhesive on the substrate for attachment.

In one embodiment of the above manufacturing method, the attaching of the plurality of one-metal layer carriers includes: aligning the plurality of one-metal layer carriers adjacent to each other; and curing the lamination adhesive on the substrate of each the plurality of one-metal layer carriers to laminate the plurality of one-metal layer carriers with each other. The laminated one-metal layer carriers may include a first side on which the one of the plurality of circuit layers is disposed, and a second side opposite to the first side. In one embodiment, the method of manufacturing the printed circuit board further includes: disposing a second one of the plurality of circuit layers on the second side of the laminated one-metal layer carriers to complete a formation of the printed circuit board. Here, a third one of the plurality of circuit layers may be disposed between the one of the plurality of circuit layers and the second one of the plurality of circuit layers.

In one embodiment of the above manufacturing method, the plurality of circuit layers of the printed circuit board manufactured using the single lamination cycle includes at least four circuit layers.

In one embodiment of the above manufacturing method, the plurality of circuit layers of the printed circuit board manufactured using the single lamination cycle includes at least five circuit layers.

In one embodiment of the above manufacturing method, the plurality of circuit layers of the printed circuit board manufactured using the single lamination cycle includes at least six circuit layers.

In one embodiment of the above manufacturing method, the plurality of circuit layers of the printed circuit board manufactured using the single lamination cycle includes at least seven circuit layers.

In one embodiment of the above manufacturing method, the plurality of circuit layers of the printed circuit board manufactured using the single lamination cycle includes at least eight circuit layers.

In one embodiment of the above manufacturing method, the substrate includes a core material selected from the group consisting of metal, ceramic, FR4, GPY, and combinations thereof.

In one embodiment of the above manufacturing method, the protective film includes a material selected from the group consisting of polyester, oriented polypropylene, polyvinylfluoride, polyethylene, high density polyethylene, polyethylene napthalate, pacothane, polymethylpentene, and combinations thereof. Here, the polyester film may be Mylar.

In one embodiment of the above manufacturing method, the at least one micro via is formed by laser drilling.

In one embodiment of the above manufacturing method, the at least one micro via is formed by mechanical drilling.

In one embodiment of the above manufacturing method, the at least one photo resist is imaged by laser-direct-imaging.

In one embodiment of the above manufacturing method, the at least one photo resist is imaged by photo imaging, silkscreen imaging, offset imaging, and/or inkjet imaging.

In one embodiment of the above manufacturing method, the plurality of circuit layers of the printed circuit includes an odd number of circuit layers.

In one embodiment of the above manufacturing method, the parallel processing of at least another one of the plurality of one-metal layer carriers includes: imaging at least one photo resist onto a metal plate having at least one copper flash formed on at least one side of the metal plate to develop at least one cavity; plating copper into the at least one cavity; stripping off the at least one photo resist to form at least one copper foil pad for one of the plurality of circuit layers; applying prepreg on the at least one copper foil pad to laminate the prepreg with the metal plate; curing the prepreg laminated with the metal plate with the at least one copper foil pad and the at least one copper flash therebetween; peeling the at least one copper foil pad and the at least one copper flash with the cured prepreg from the metal plate; and etching off the at least one copper flash to expose the at least one copper foil pad on the cured prepreg. Here, the parallel processing of the at least another one of the plurality of one-metal layer carriers may further include: forming at least one micro via into the cured prepreg to expose the at least one copper foil pad at opposite sides of the cured prepreg; and filling at least one conductive paste into the at least one micro via formed in the cured prepreg.

An embodiment of the present invention provides a method of manufacturing a printed circuit board having a plurality of circuit layers with at least one z-axis interconnect using a single lamination cycle. The method includes attaching a plurality of one-metal layer carriers with each other after parallel processing each of the plurality of one-metal layer carriers. The parallel processing of at least one of the plurality of one-metal layer carriers includes: imaging at least one photo resist onto a metal plate having at least one copper flash formed on at least one side of the metal plate to develop at least one cavity; plating copper into the at least one cavity; stripping off the at least one photo resist to form at least one copper foil pad for one of the plurality of circuit layers; applying a first side of a prepreg on the at least one copper foil pad to laminate the prepreg with the metal plate; curing the prepreg laminated with the metal plate with the at least one copper foil pad and the at least one copper flash therebetween; peeling the at least one copper foil pad and the at least one copper flash with the cured prepreg from the metal plate; etching off the at least one copper flash to expose the at least one copper foil pad on the cured prepreg; applying a lamination adhesive on the cured prepreg; applying a protective film on the lamination adhesive; forming at least one micro via into the cured prepreg to expose the at least one copper foil pad at a second side of the cured prepreg opposite to the first side of the cured prepreg; filling at least one conductive paste into the at least one micro via formed in the cured prepreg; and removing the protective film to expose the lamination adhesive on the cured prepreg for attachment.

An embodiment of the present invention provides a printed circuit board including: a plurality of circuit layers, a plurality of substrates, a plurality of lamination adhesives, and a plurality of one-metal layer carriers. Each of the plurality of circuit layers has at least one copper foil pad. Each of the plurality of substrates is interposed between one and a corresponding one of the plurality of circuit layers and includes at least one micro via having a conductive paste filled therein to interconnect the at least one copper foil pad of the one and the at least one copper foil pad of the corresponding one of the plurality of circuit layers. Each of the plurality of lamination adhesives is interposed between one and a corresponding one of the plurality of substrates. Each of the plurality of one-metal layer carriers includes one of the plurality of circuit layers, a corresponding one of the substrates, and a corresponding one of the plurality lamination adhesives. In addition, the plurality of circuit layers are electrically coupled with each other through the at least one micro via of each of the plurality of substrates, and the plurality of one-metal layer carriers are aligned adjacent to each other, and laminated with each other by curing the plurality of lamination adhesives using a single lamination cycle.

In one embodiment of the above printed circuit board, the plurality of circuit layers of the printed circuit includes at least four circuit layers.

In one embodiment of the above printed circuit board, the plurality of circuit layers of the printed circuit includes at least five circuit layers.

In one embodiment of the above printed circuit board, the plurality of circuit layers of the printed circuit includes at least six circuit layers.

In one embodiment of the above printed circuit board, the plurality of circuit layers of the printed circuit includes at least seven circuit layers.

In one embodiment of the above printed circuit board, the plurality of circuit layers of the printed circuit includes at least eight circuit layers.

In one embodiment of the above printed circuit board, at least one of the plurality of substrates includes a core material selected from the group consisting of metal, ceramic, FR4, GPY, and combinations thereof.

In one embodiment of the above printed circuit board, the plurality of circuit layers of the printed circuit comprises an odd number of circuit layers.

BRIEF DESCRIPTION OF THE DRAWINGS

The accompanying drawings, together with the specification, illustrate exemplary embodiments of the present invention, and, together with the description, serve to explain the principles of the present invention.

FIGS. 1a, 1b, 1c, 1d, 1e, 1f, 1g, 1h, and 1i show a method of manufacturing a printed circuit board using a single lamination cycle or process sequence with stacked (or staggered) micro vias according to a first exemplary embodiment of the present invention.

FIGS. 3a, 3b, 3c, 3d, 3e, 3f, 3g, 3h, 3i, and 3j show a method of manufacturing a printed circuit board using two lamination cycle or process sequence with stacked (or staggered) micro vias according to a second exemplary embodiment of the present invention.

FIGS. 5a, 5b, 5c, 5d, 5e, 5f, 5g, 5h, 5i, 5j, and 5k show a method of manufacturing a printed circuit board using one to two lamination cycle or process sequence with stacked (or staggered) micro vias according to a third exemplary embodiment of the present invention.

FIGS. 7a, 7b, 7c, and 7d show a method of manufacturing a printed circuit board using a lamination process sequence for four or more circuit layers with stacked (or staggered) micro vias according to a fourth exemplary embodiment of the present invention.

DETAILED DESCRIPTION

Figure 2:
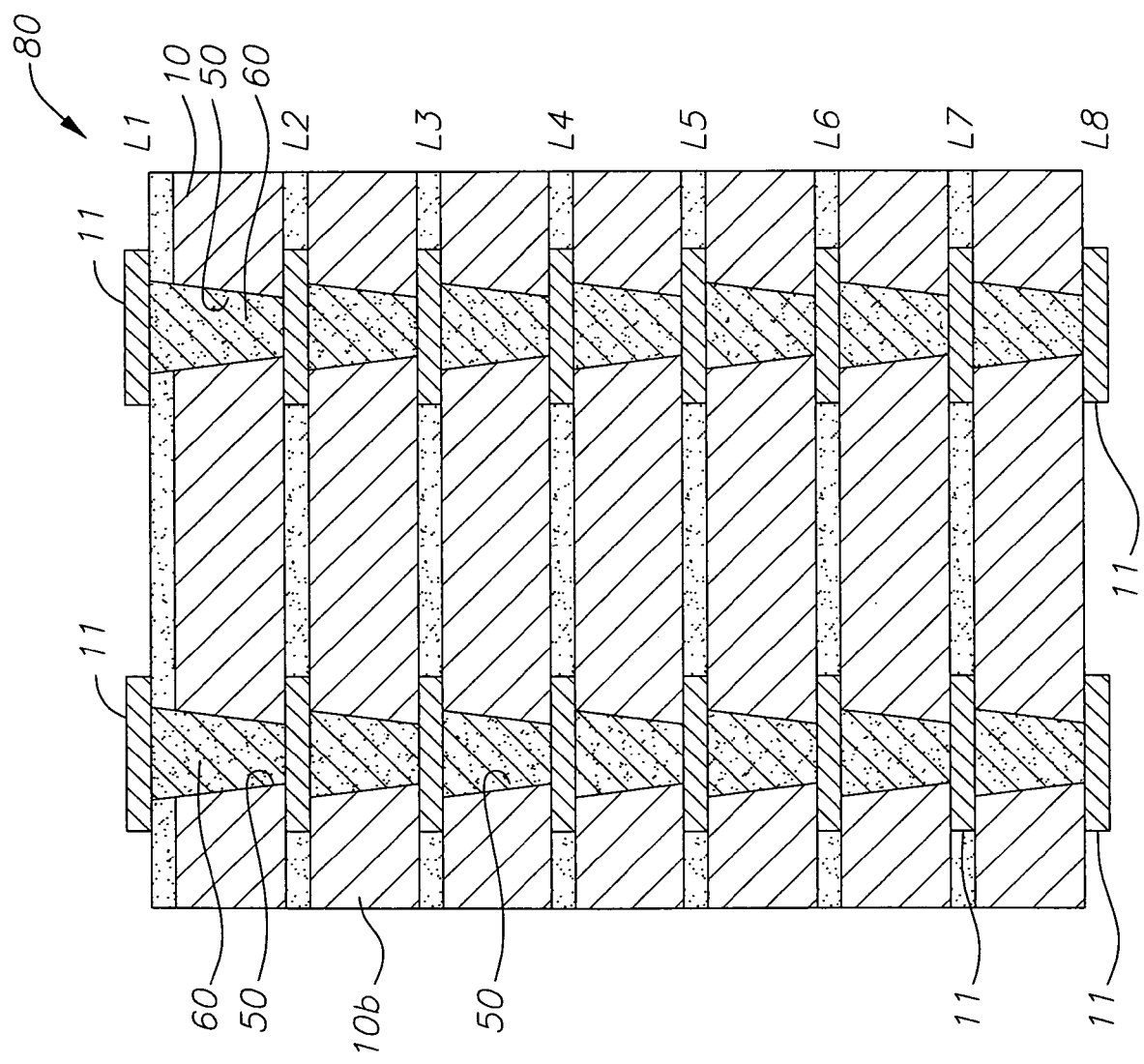
FIG. 2 shows a cross-sectional view of an embodiment of a printed circuit board manufactured by the method(s) shown in FIGS. 1a, 1b, 1c, 1d, 1e, 1f, 1g, 1h, 1i, and/or 9.

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive. There may be parts shown in the drawings, or parts not shown in the drawings, that are not discussed in the specification as they are not essential to a complete understanding of the invention. Like reference numerals designate like elements.

First Exemplary Embodiment

A method of manufacturing a printed circuit board using a single lamination cycle or process sequence with stacked (or staggered) micro vias according to a first exemplary embodiment of the present invention will be described with reference to FIGS. 1a, 1b, 1c, 1d, 1e, 1f, 1g, 1h, and 1i.

As shown in FIG. 1a, a two-sided core or substrate 10 is prepared (step 1). The substrate 10 includes a copper foil 10a formed on opposite sides of the substrate 10 and a core material 10b made of metal, ceramic, or insulating material (e.g., FR4, LCP, Thermount, BT, GPY, such as Teflon, thermally conducting carbon (stablecor), halogen free, etc., wherein GPY is a laminate that does not fit in the FR4 category, such as polyimide, aziridine cured epoxy, bismalimide, and other electrical grades of laminate). The present invention, however, is not thereby limited. For example, in one embodiment of the present invention, a single sided core or substrate is used having a copper foil (e.g., a single foil 10a) formed on only one side of the substrate.

Also, in one embodiment and as shown in FIG. 1a, the substrate 10 has a thickness ranging from 0.003" to 0.004". However, the present invention is not thereby limited.

In FIG. 1b, one or more photo resists 20 are imaged onto the substrate 10 (step 2). Here, two photo resists 20 are shown to be laser-direct-imaged (or printed) onto one side of the substrate 10 (i.e., the bottom side). However, the present invention is not thereby limited. For example, the two photo resists can be imaged using any suitable printing technique, such as photo, silkscreen, offset, inkjet, etc.

In FIG. 1c, the copper foil 10a is etched off from the substrate 10 with exception of the parts of the copper foil 10a covered by the two photo resists 20, which are then stripped off to expose corresponding (or two) copper foil pads 11 (step 3). The present invention, however, is not thereby limited. For example, in another embodiment of the present invention and as shown in FIG. 9, one or more one-metal layer carriers (e.g., one or more single sided circuits) are formed by preparing a metal plate (e.g., a stainless steel plate).

Figure 9:
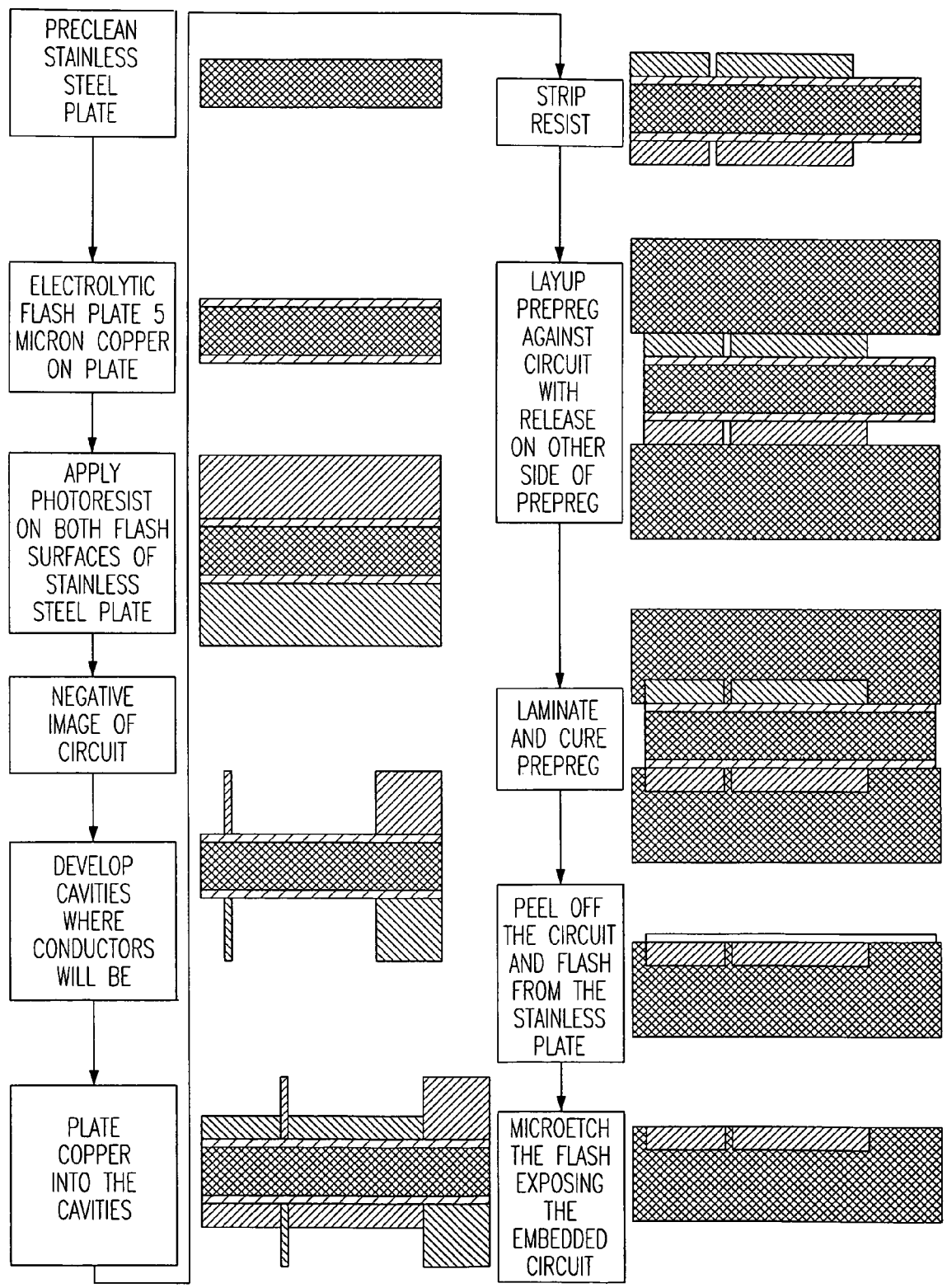
FIG. 9 shows a method of manufacturing a printed circuit board using a single lamination cycle or process sequence with stacked (or staggered) micro vias according to another exemplary embodiment of the present invention.
Figure 5I:
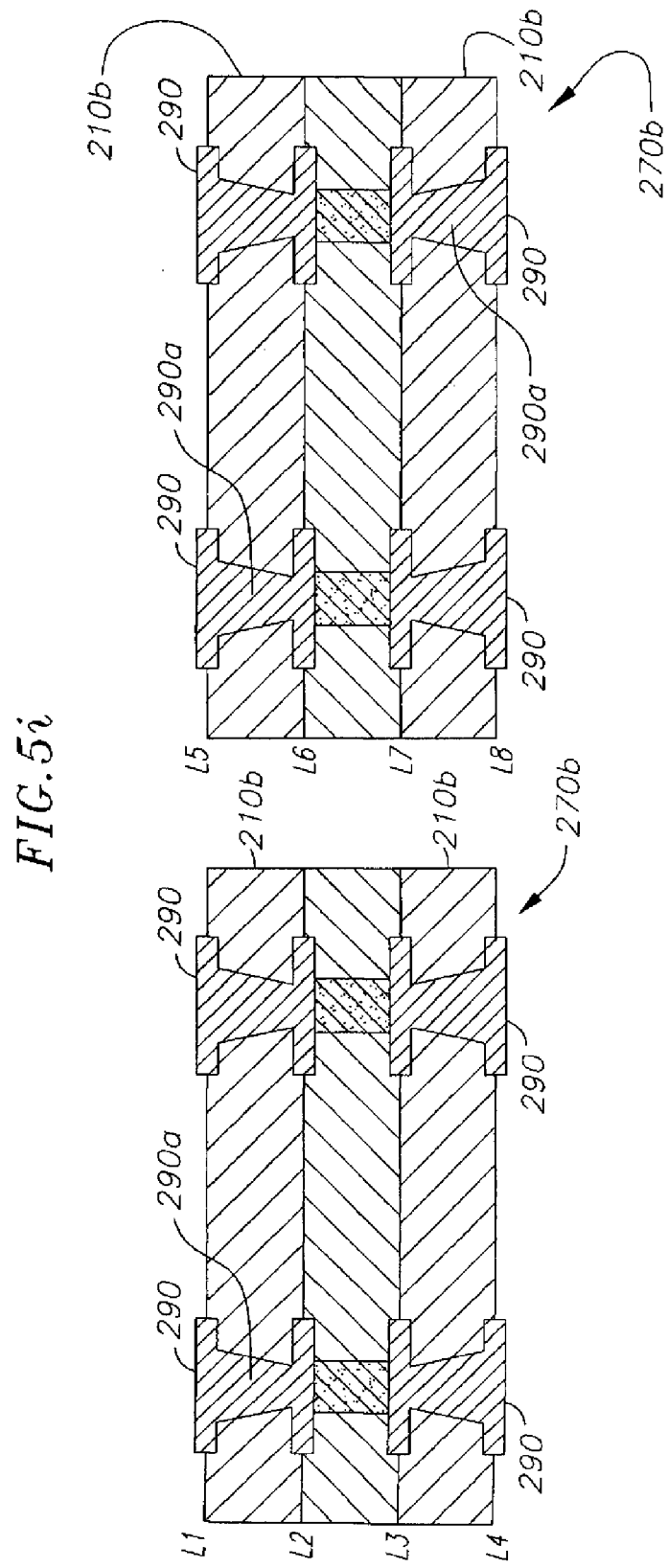

In more detail and referring to FIG. 9, a copper flash (about five microns) is electrolytic flash plated onto one or more sides the metal plate. One or more photo resists are applied to the one or more flash surfaces of the metal plate. The photo resists are then imaged (i.e., negative imaged) to develop one or more cavities. Copper is then plated into the cavities. The photo resists are then stripped off to form one or more copper foil pads for one or more circuit layers. In addition, one or more prepregs are applied on the copper foil pads to laminate the prepregs with the metal plate, and then cured. The prepregs are laminated and cured with the metal plate with the copper foil pads and the copper flashes therebetween. The copper foil pads and the copper flashes with the cured prepregs are then peeled from the metal plate. The copper flashes are then etched off to expose the copper foil pads on the cured prepregs.

Once the above described circuit layer including the copper foil pads (e.g., pads 11 or the circuit layer including the copper pads of FIG. 9) has been formed, a protective film (or Mylar sheet) 40 shown in FIG. 1d is attached to the core material 10b of the substrate 10 (or the cured prepreg of FIG. 9) with a lamination adhesive (or prepreg or uncured prepreg) 30 interposed between the Mylar sheet 40 (step 4) and the core material 10b. Here, in FIG. 1d, the Mylar sheet 40 is shown to be attached to the side of the substrate 10 opposite to the side of the substrate 10 where the two copper foil pads 11 are located. The protective film of the present invention, however, is not limited to only Mylar sheet, and can be made of any suitable material, such as polyester, oriented polypropylene, polyvinylfluoride, polyethylene, high density polyethylene, polyethylene napthalate, pacothane, polymethylpentene, or combinations thereof.

In FIG. 1e, micro vias 50 are formed in the substrate 10 (or the cured prepreg of FIG. 9) (step 5). Each of the micro vias 50 is formed by laser drilling (and/or mechanical drilling) a hole having a diameter ranging from 0.004" to 0.010" into the substrate 10 (or the cured prepreg of FIG. 9).

In FIG. 1f, a conductive paste (or ink) 60 is then filled into each of the micro vias 50 formed in the substrate 10 (or the cured prepreg of FIG. 9) (step 6), and in FIG. 1g, the Mylar sheet 40 is then peeled off to form a one (1)-metal layer carrier 70 for lay-up and lamination as shown in FIGS. 1h and 1i (step 7).

That is, as shown in FIG. 1h, a plurality of 1-metal layer carriers 70 shown in FIG. 1g are attached after parallel processing to make "N" number of circuit layers for a printed circuit board 80 (step 8). In FIG. 1h, the printed circuit board 80 is shown to have eight (8) circuit layers L1, L2, L3, L4, L5, L6, L7, and L8; or an 8 layer printed circuit board is shown.

Finally, as shown in FIG. 1i, the 8 layer printed circuit board 80 including the lamination adhesives 30 is cured to laminate the circuit layers L1, L2, L3, L4, L5, L6, L7, and L8 with each other to form the 8 layer printed circuit board 80 (step 9). In FIG. 1i, only circuit layer L1 needs to be printed and etched to complete (or finish) the printed circuit board 80 and/or to form the copper foil pads 11.

FIG. 2 is a cross-sectional view showing an embodiment of a printed circuit board 80 manufactured by the method(s) shown in FIGS. 1a, 1b, 1c, 1d, 1e, 1f, 1g, 1h, 1i, and/or 9. The same reference numbers are used in FIG. 2 to refer to the same or like parts shown in FIGS. 1a-1i.

The printed circuit board 80 shown in FIG. 2 includes a plurality of circuit layers L1, L2, L3, L4, L5, L6, L7, and L8. Each of the circuit layers L1, L2, L3, L4, L5, L6, L7, and L8 of the printed circuit board 80 is formed with one or more copper foil pads 11. A core material 10b having a thickness ranging, for example, from 0.0003" to 0.004", from 0.002" to 0.004", or from 0.003" to 0.004", is interposed between one and a corresponding one of the circuit layers L1, L2, L3, L4, L5, L6, L7, and L8 (e.g., between circuit layers L1 and L2). For example, in one embodiment, the core material 10b is formed of a glass reinforced (106) FR4 having a thickness that is 0.002" or greater. In another embodiment, the core material 10b is formed of a non-reinforced polyimide film system having a thickness that is 0.0003" or greater. The core material 10b includes one or more micro vias 50 each having a conductive paste 60 filled therein. The conductive pastes 60 electrically interconnect the conductive copper foil pads 11 throughout the circuit layers L1, L2, L3, L4, L5, L6, L7, and L8. As such, the printed circuit board 80 manufactured by the method shown in FIGS. 1a, 1b, 1c, 1d, 1e, 1f, 1g, 1h, 1i, and/or 9 can be used to enable a quick turnaround for ball grid array packages, high density electronic circuit boards, etc. For example, by eliminating the sequential lamination and multiple orbiting the sequence of processes for creating the conductors and layer to layer interconnect(s), several enhancements can occur, such as: (1) fewer process steps, as low as ¼ the number of steps of a conventional process, and fewer steps equal fewer opportunities for scrap(s) and/or mistake(s); (2) lower costs from yield loss and/or higher quality of finished goods; (3) improved registration capability to allow for higher density product (e.g., smaller landing pads to meet similar annular ring requirements); (4) improved plant capacity (e.g., by several hundred percent for this type of product); (5) extension of stacked micro-via technology to much higher layer counts (e.g., all cores are made at the same time, so they all shrink at the same time during lamination and can be up to 44+ layers); and (6) odd layer counts (i.e., most multilayer boards have even layer counts now).

Secondary Exemplary Embodiment

A method of manufacturing a printed circuit board using two lamination cycle or process sequence with stacked (or staggered) micro vias according to a second exemplary embodiment of the present invention will be described with reference to FIGS. 3a, 3b, 3c, 3d, 3e, 3f, 3g, 3h, 3i, and 3j.

As shown in FIG. 3a, a single sided core or substrate 100 is prepared (step 1). The substrate 100 includes a copper foil 100a formed on one side of the substrate 100 (e.g., on a bottom side of the substrate 100) and a core material 100b made of metal, ceramic, or insulating material (e.g., FR4, Polyimide, LCP, Thermount, BT, GPY, such as Teflon, thermally conducting carbon (stablecor), halogen free, etc.). In one embodiment and as shown in FIG. 3a, the substrate 100 has a thickness ranging from 0.003", to 0.004".

In FIG. 3b, a protective file (or Mylar sheet) 140 is attached to the core material 100b of the substrate 100 with a lamination adhesive (or prepreg) 130 interposed between the Mylar sheet 140 (step 2) and the core material 101b. Here, the Mylar sheet 40 is shown to be attached to the side of the substrate 100 opposite to the side of the substrate 100 where the copper foil 100a is located, and has a thickness of 0.001". The protective film of the present invention, however, is not limited to only Mylar sheet, and can be made of any suitable material, such as polyester, oriented polypropylene, polyvinylfluoride, polyethylene, high density polyethylene, polyethylene napthalate, pacothane, polymethylpentene, or combinations thereof.

In FIG. 3c, micro vias 150 are formed in the substrate 100 (step 3). Each of the micro vias 150 is formed by laser drilling (or mechanical drilling) a hole having a diameter ranging from 0.004" to 0.010" into the substrate 100.

In FIG. 3d, a conductive paste (or ink) 160 is then filled into each of the micro vias 150 formed in the substrate 100 (step 4).

In FIG. 3e, the Mylar sheet 140 is then peeled off and replaced by a copper foil 100a' (that may or may not be identical to the copper foil 100a) to end up with the adhesive 130 between the copper foil 100a' and the core material 100b (step 5). Here, the copper foil 100a' is laminated to the substrate 100 with the adhesive 130 by a curing process.

In FIG. 3f, one or more photo resists 120 are imaged onto the opposite sides of the substrate 100 (step 6). Here, two photo resists 120 are shown to be laser-direct-imaged (or printed) either side of the substrate 100 (and a total of four photo resists 120 are shown).

In FIG. 3g, the copper foil 100a and the copper foil 100a' are etched off from the substrate 10 with exception of the parts of the copper foils 10a covered by the four photo resists 120, which are then stripped off to expose corresponding (or four) copper foil pads 111, to form a two (2)-metal layer carrier 170 (step 7).

In FIG. 3h, a protective film (or Mylar sheet) 140' is attached to the 2-metal layer carrier 170 with a lamination adhesive (or prepreg or bond ply) 130' interposed between the Mylar sheet 140' and the 2-metal layer carrier 170, and micro vias 150' are formed in the substrate 100 with a conductive paste (or ink) 160' filled into each of the micro vias 150' (step 8). Here, the lamination adhesive has a thickness ranging from 0.002" to 0.003", and each of the micro vias 150' is formed by laser drilling (or mechanical drilling) a hole having a diameter ranging from 0.004" to 0.010", into the lamination adhesive 130'. The Mylar sheet 140' is then peeled off for lay-up and lamination as shown in FIGS. 3i and 3j. The protective film of the present invention, however, is not limited to only Mylar sheet, and can be made of any suitable material, such as polyester, oriented polypropylene, polyvinylfluoride, polyethylene, high density polyethylene, polyethylene napthalate, pacothane, polymethylpentene, or combinations thereof.

That is, as shown in FIG. 3i, a plurality of 2-metal layer carriers 170 each having the lamination adhesive 130' and a last (or top) 2-metal layer carrier 170 not formed with the lamination adhesive 130' are attached after parallel processing to make "N" number of layers for a printed circuit board 180 (step 9). In FIG. 3i, the printed circuit board 180 is shown to have eight (8) circuit layers L11, L12, L13, L14, L15, L16, L17, and L18; or an 8 layer printed circuit board is shown.

Finally, as shown in FIG. 3j, the 8 layer printed circuit board 180 including the lamination adhesives 130' is cured to laminate the circuit layers L11, L12, L13, L14, L15, L16, L17, and L18 with each other to form the 8 layer printed circuit board 180.

Figure 4:
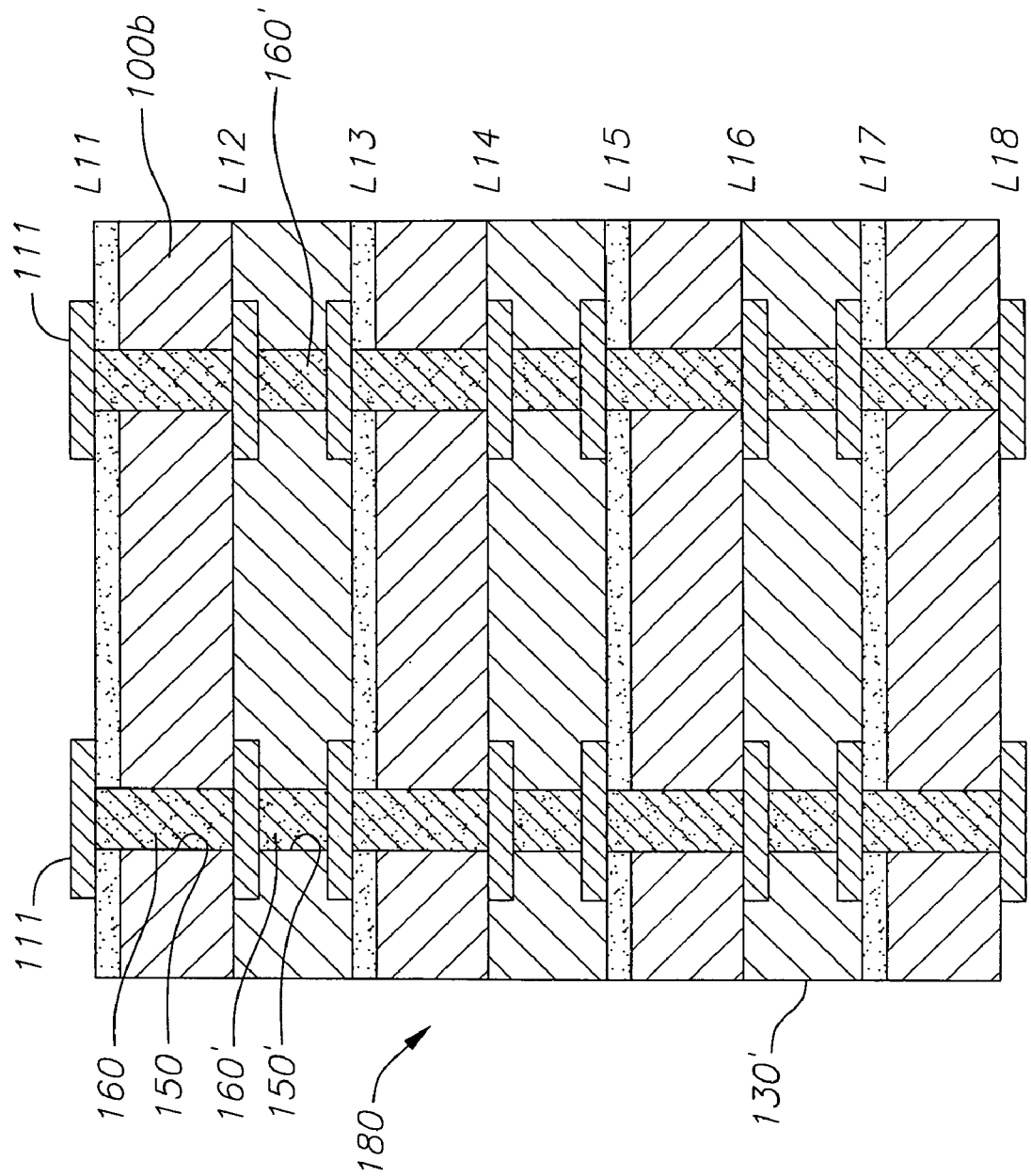
FIG. 4 shows a cross-sectional view of an embodiment of a printed circuit board manufactured by the method shown in FIGS. 3a-1j.

FIG. 4 is a cross-sectional view showing an embodiment of a printed circuit board 180 manufactured by the method shown in FIGS. 3a-3j. The same reference numbers are used in FIG. 4 to refer to the same or like parts shown in FIGS. 3a-3j.

The printed circuit board 180 shown in FIG. 4 includes a plurality of circuit layers L11, L12, L13, L14, L15, L16, L17, and L18. Each of the circuit layers L11, L12, L13, L14, L15, L16, L17, and L18 of the printed circuit board 180 is formed with one or more copper foil pads 111. A core material 100b having a thickness ranging from 0.003" to 0.004" is interposed between one and a corresponding one of the circuit layers L11, L12, L13, L14, L15, L16, L17, and L18 (e.g., between the circuit layers L11 and L12), or a lamination adhesive 130' having a thickness ranging from 0.002" to 0.003", is interposed between one and a corresponding one of the circuit layers L11, L12, L13, L14, L15, L16, L17, and L18 (e.g., between the circuit layers L12 and L13). The core material 100a includes one or more micro vias 150 each having a conductive paste 160 filled therein, and the lamination adhesive 130' includes one or more micro vias 150' each having a conductive paste 160' filled therein. The micro vias 150' of the lamination adhesive 130' correspond with the respective micro vias 150 of the core material 130a. The conductive pastes 160 and 160' electrically interconnect the conductive copper foil pads 111 throughout the circuit layers L11, L12, L13, L14, L15, L16, L17, and L18. As such, the printed circuit board 180 manufactured by the method shown in FIGS. 3a-3j can be used to enable a quick turnaround for ball grid array packages and/or high density electronic circuit boards.

Third Exemplary Embodiment

A method of manufacturing a printed circuit board using one to two lamination process cycle or sequence with stacked (or staggered) micro vias according to a third exemplary embodiment of the present invention will be described with reference to FIGS. 5a, 5b, 5c, 5d, 5e, 5f, 5g, 5h, 5i, 5j, and 5(k).

As shown in FIG. 5a, a two sided core or substrate is imaged (or printed or masked) and etched to form a first copper padded carrier 200a having a thickness of 0.0025" and including circuit layers L23 and L24 on opposite sides of the first copper padded carrier 200a. Here, copper foil pads (e.g., two copper foil pads) 211 are formed on the circuit layer L23, and a copper foil 210a is formed on the circuit layer L24. Also, in FIG. 5a, a protective film (or Mylar sheet) 240 is shown to be attached to the first copper padded carrier 200a with a bond ply 230 (e.g., 1080 HR) interposed between the Mylar sheet 240 and the two copper foil pads 211 (step 1). The protective film of the present invention, however, is not limited to only Mylar sheet, and can be made of any suitable material, such as polyester, oriented polypropylene, polyvinylfluoride, polyethylene, high density polyethylene, polyethylene napthalate, pacothane, polymethylpentene, or combinations thereof.

In FIG. 5b, micro vias 250 are formed in the bond ply 230 (step 2). Each of the micro vias 250 is formed by laser drilling (or mechanical drilling) a hole having a diameter ranging from 0.004", to 0.010" into the bond ply 230.

In FIG. 5c, a conductive paste (or ink) 260 is then filled into each of the micro vias 250 formed in the bond ply 230 (step 3).

In FIG. 5d, the Mylar sheet 240 is then peeled off, and a second copper padded carrier 200b having a thickness of 0.0025" and including circuit layers L21 and L22 on opposite sides of the second copper padded carrier 200b is attached to the first copper padded carrier 200a with the bond ply 230 interposed therebetween to form a first four-layer substrate 270a having the circuit layers L21, L22, L23, and L24 (step 4). Here, the second copper padded carrier 200b includes copper foil pads (e.g., two copper foil pads) 211 formed on circuit layer L22, and a copper foil 210a is formed on circuit layer L21. The conductive pastes 260 in the micro vias 250 electrically interconnect the conductive copper foil pads 211 of the circuit layer L22 and the conductive copper foil pads 211 of the circuit layer L23.

FIGS. 5e-5h show a method for manufacturing a second four-layer substrate 270b having the circuit layers L25, L26, L27, and L28. The second four-layer substrate 270b can be combined with the first four-layer substrate 270a manufactured by the method shown in FIGS. 5a-5d to form a final printed circuit board 280 shown in FIGS. 5k and/or 6.

As shown in FIGS. 5e-5h, the second four-layer substrate 270b having the circuit layers L25, L26, L27, and L28 is manufacture by steps 5, 6, 7, and 8. These four steps 5, 6, 7, and 8 shown in FIGS. 5e-5h are substantially similar to the method for manufacturing the first four-layer substrate 270a having the circuit layers l21, L22, L23, and L24 in steps 1, 2, 3, and 4 shown in FIGS. 5a-5d (and, as such, a detailed description for manufacturing the second four-layer substrate 270b will not be provided in more detail).

Figure 5I:
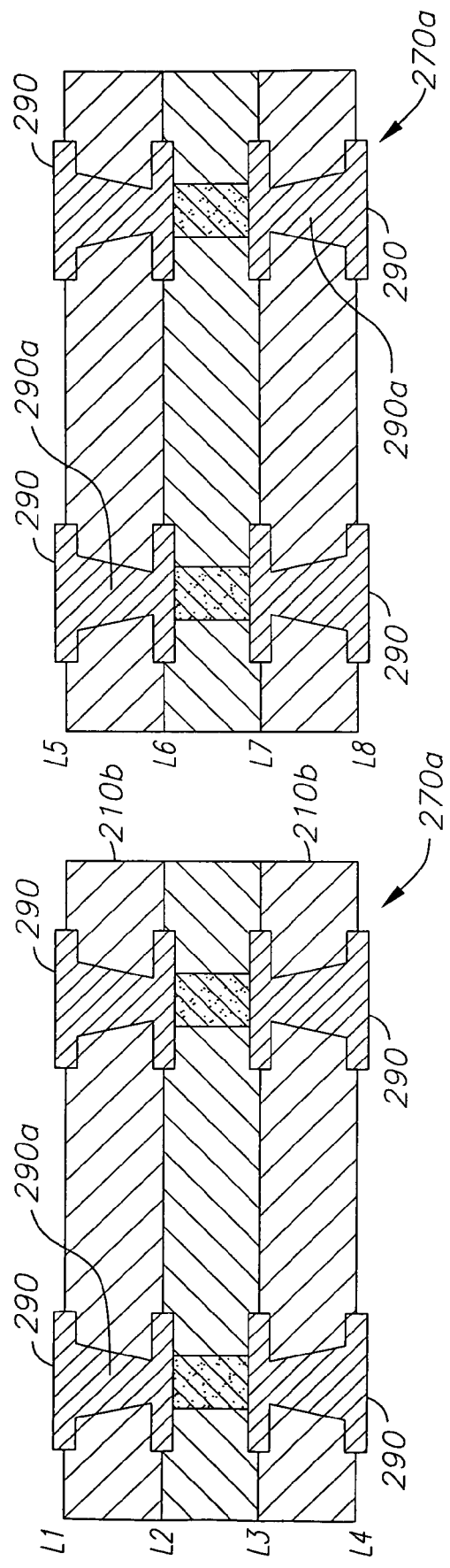

In FIG. 5i, micro via plates 290 are formed with each of the first four-layer substrate 270a and the second four-layer substrate 270b through laser drilling (or mechanical drilling) and plating. Each of the micro via plates 290 includes an extended portion 290a extending into a corresponding core material 210b. Here, the extended portions 290a of the micro via plates 290 of the circuit layer L21 are formed through the core material 210b between the circuit layers L21 and L22 such that the micro via plates 290 of the circuit layer L21 are electrically interconnected to the conductive copper foil pads 211 of the circuit layer L22 by the extended portions 290a. The extended potions 290a of the micro via plates 290 of the circuit layer L24 are formed through the core material 210b between the circuit layers L24 and L23 such that the micro via plates 290 of the circuit layer L21 are electrically interconnected to the conductive copper foil pads 211 of the circuit layer L23 by the extended portions 290a. The extended portions 290a of the micro via plates 290 of the circuit layer L25 are formed through the core material 210b between the circuit layers L25 and L26 such that the micro via plates 290 of the circuit layer L25 are electrically interconnected to the conductive copper foil pads 211 of the circuit layer L26 by the extended portions 290a. Finally, the extended portions 290a of the micro via plates 290 of the circuit layer L28 are formed through the core material 210b between the circuit layers L28 and L27 such that the micro via plates 290 of the circuit layer L28 are electrically interconnected to the conductive copper foil pads 211 of the circuit layer L27 by the extended portions 290a.

Figure 5K:
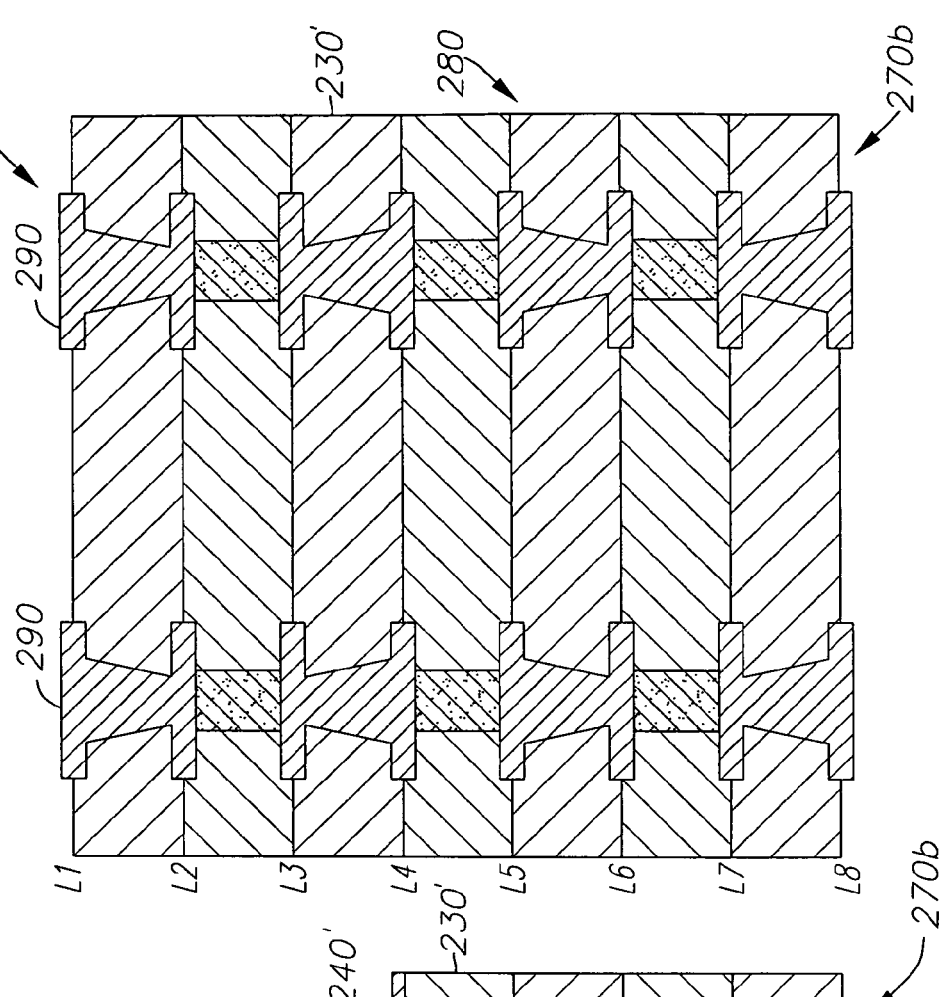
Figure 5J:
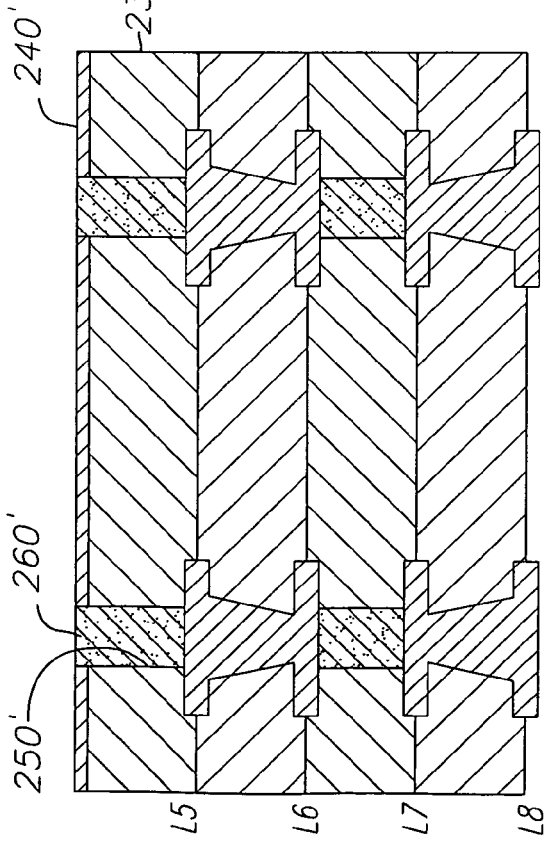

In FIG. 5j, a protective film (or Mylar sheet) 240' is shown to be attached to the second four-layer substrate 270b with a prepreg 230' (e.g., 1X2113 or 1080 HR) interposed between the Mylar sheet 240' and the circuit layer L25 of the second four-layer substrate 270b. The protective film of the present invention, however, is not limited to only Mylar sheet, and can be made of any suitable material, such as polyester, oriented polypropylene, polyvinylfluoride, polyethylene, high density polyethylene, polyethylene napthalate, pacothane, polymethylpentene, or combinations thereof. Here, micro vias 250' are formed in the prepreg 230', each of the micro vias 250' are formed by laser drilling (or mechanical drilling) a hole having a diameter ranging from 0.004" to 0.010" into the prepreg 230', and a conductive paste (or ink) 260' is then filled into each of the micro vias 250' formed in the prepreg 230'.

Finally, as shown in FIG. 5k, the final printed circuit board (or an 8 layer printed circuit board) 280 is formed by removing the Mylar sheet 240', placing the first four-layer substrate 270a on the second four-layer substrate 270b such that the prepreg 230' is between the circuit layer L25 of the second four-layer substrate 270b and the circuit layer L24 of the first four-layer substrate 270a, and then curing the first four-layer substrate 270a with the second four-layer substrate 270b to form the final printed circuit board (or an 8 layer printed circuit board) 280.

Figure 6:
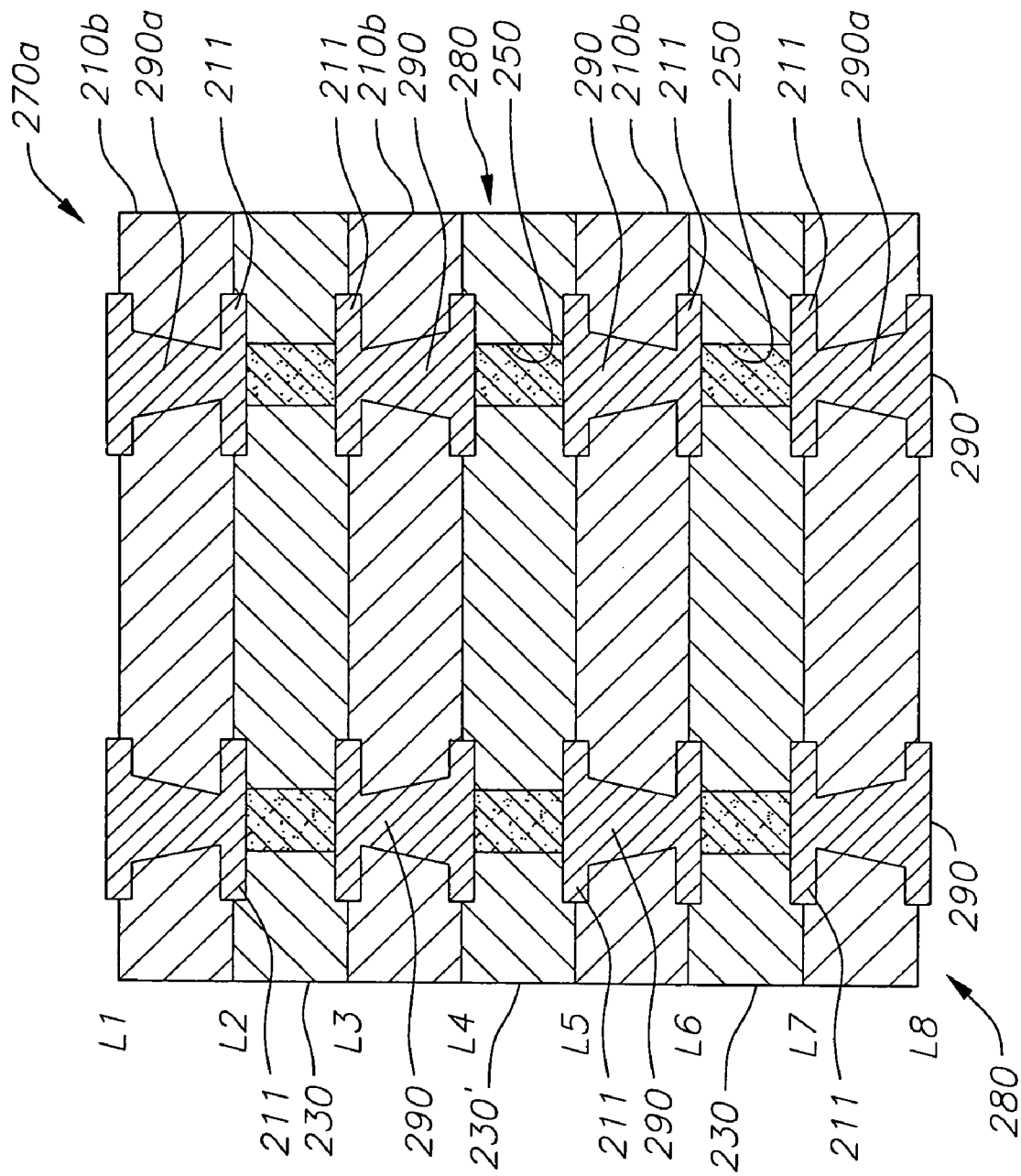
FIG. 6 shows a cross-sectional view of an embodiment of a printed circuit board manufactured by the method shown in FIGS. 5a-5(k).

FIG. 6 is a cross-sectional view showing an embodiment of a printed circuit board 280 manufactured by the method shown in FIGS. 5a-5k. The same reference numbers are used in FIG. 6 to refer to the same or like parts shown in FIGS. 5a-5k.

The printed circuit board 280 shown in FIG. 6 includes a plurality of circuit layers L21, L22, L23, L24, L25, L26, L27, and L28. Each of the circuit layers L22, L23, L26, and L27 of the printed circuit board 280 is formed with one or more copper foil pads 211. Each of the circuit layers L21, L24, L25, and L28 of the printed circuit board 280 is formed with one or more micro via plates 290. A core material 210b or a lamination prepreg 230 or 230' is interposed between one and a corresponding one of the circuit layers L21, L22, L23, L24, L25, L26, L27, and L28. The core material 210b is formed to have one or more extended portions 290a of the micro via plates 290 extended therein. The lamination prepreg 230 or 230' includes one or more micro vias 250 each having a conductive paste 260 filled therein. Here, the conductive pastes 260 and the extended portions 290a of the micro via plates 290 electrically interconnect the conductive copper foil pads 211 and the micro via plates 290 throughout the circuit layers L21, L22, L23, L24, L25, L26, L27, and L28.

Fourth Exemplary Embodiment

A method of manufacturing a printed circuit board using a lamination process sequence for four or more circuit layers with stacked (or staggered) micro vias according to a fourth exemplary embodiment of the present invention will be described with reference to FIGS. 7a, 7b, 7c, and 7d.

Figure 7A:
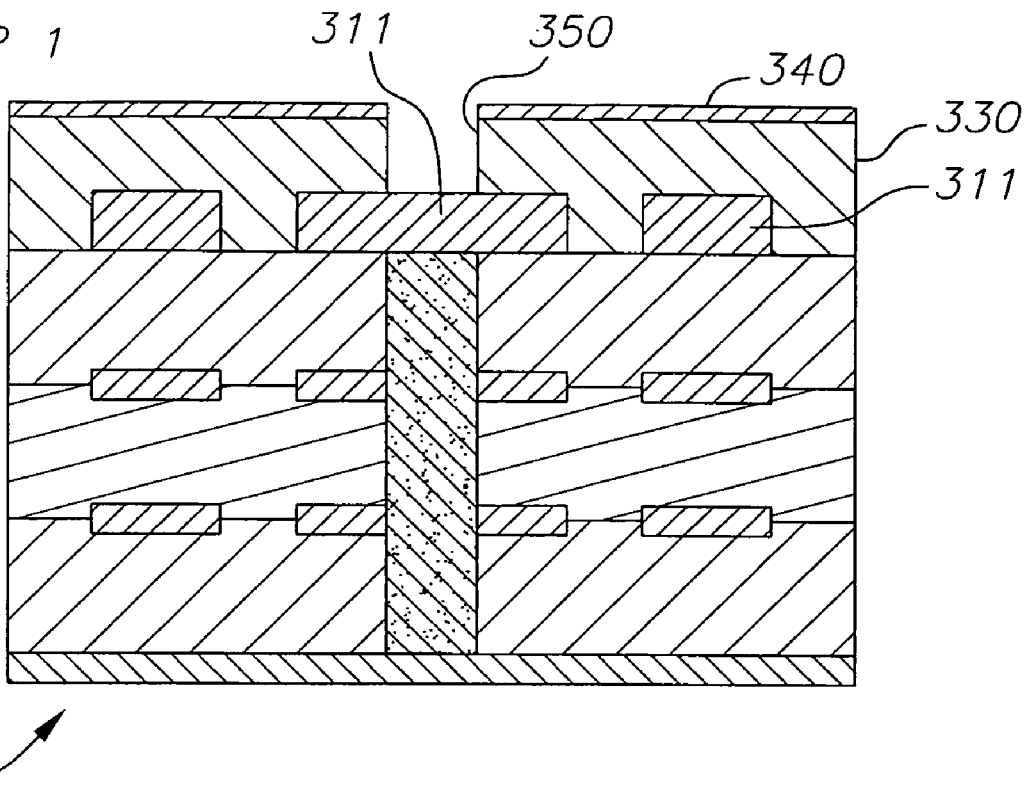

As shown in FIG. 7a, a first four-layer substrate 370 is prepared. The first four-layer substrate 370 includes three dielectric cores and/or prepregs stacked adjacent to one another to form at least four circuit layers of carrier. Here, in FIG. 7a, a protective film (or Mylar sheet) 340 is shown to be attached to the first four-layer substrate 370 with a lamination adhesive (or prepreg or bond ply) 330 interposed between the Mylar sheet 340 and the first four-layer substrate 370. The protective film of the present invention, however, is not limited to only Mylar sheet, and can be made of any suitable material, such as polyester, oriented polypropylene, polyvinylfluoride, polyethylene, high density polyethylene, polyethylene napthalate, pacothane, polymethylpentene, or combinations thereof. A micro via 350 is formed in the lamination adhesive 330 and corresponds to at least one of a plurality of copper foil pads (e.g., three copper foil pads) 311 located on a side of the first four-layer substrate 370. The micro via 350 is formed by laser drilling (or mechanical drilling) a hole having a diameter ranging from 0.004" to 0.010" into the lamination adhesive 330 (step 1). However, the present invention is not thereby limited.

Figure 7B:
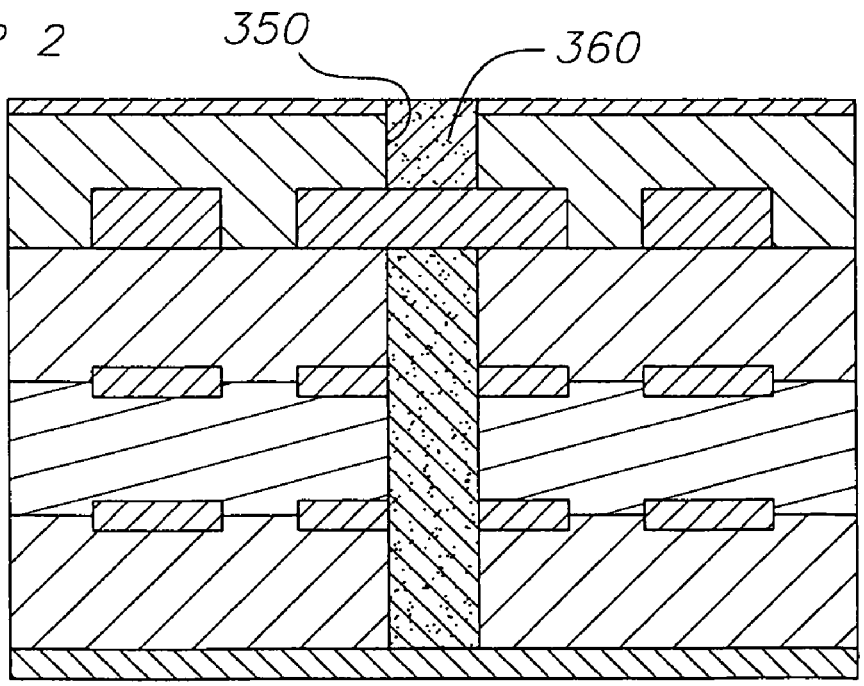

In FIG. 7b, a conductive paste (or ink) 360 is then filled into the micro via 350 formed in the lamination adhesive 330 (step 2).

Finally, as shown in FIGS. 7c and 7d, a final printed circuit board (or an 8 layer printed circuit board) 380 is formed by removing the Mylar sheet 340 (step 3) for lay-up and lamination with a second four-layer substrate 370'. That is, the second four-layer substrate 370' is placed such that the lamination adhesive 330 is between the two substrates 370 and 370' and then cured to form the final printed circuit board 380. Here, the final printed circuit board 380 is formed such that the micro via 350 also corresponds to at least one of a plurality of copper foil pads (e.g., three copper foil pads) 311 located on a side of the second four-layer substrate 370'.

Figure 8:
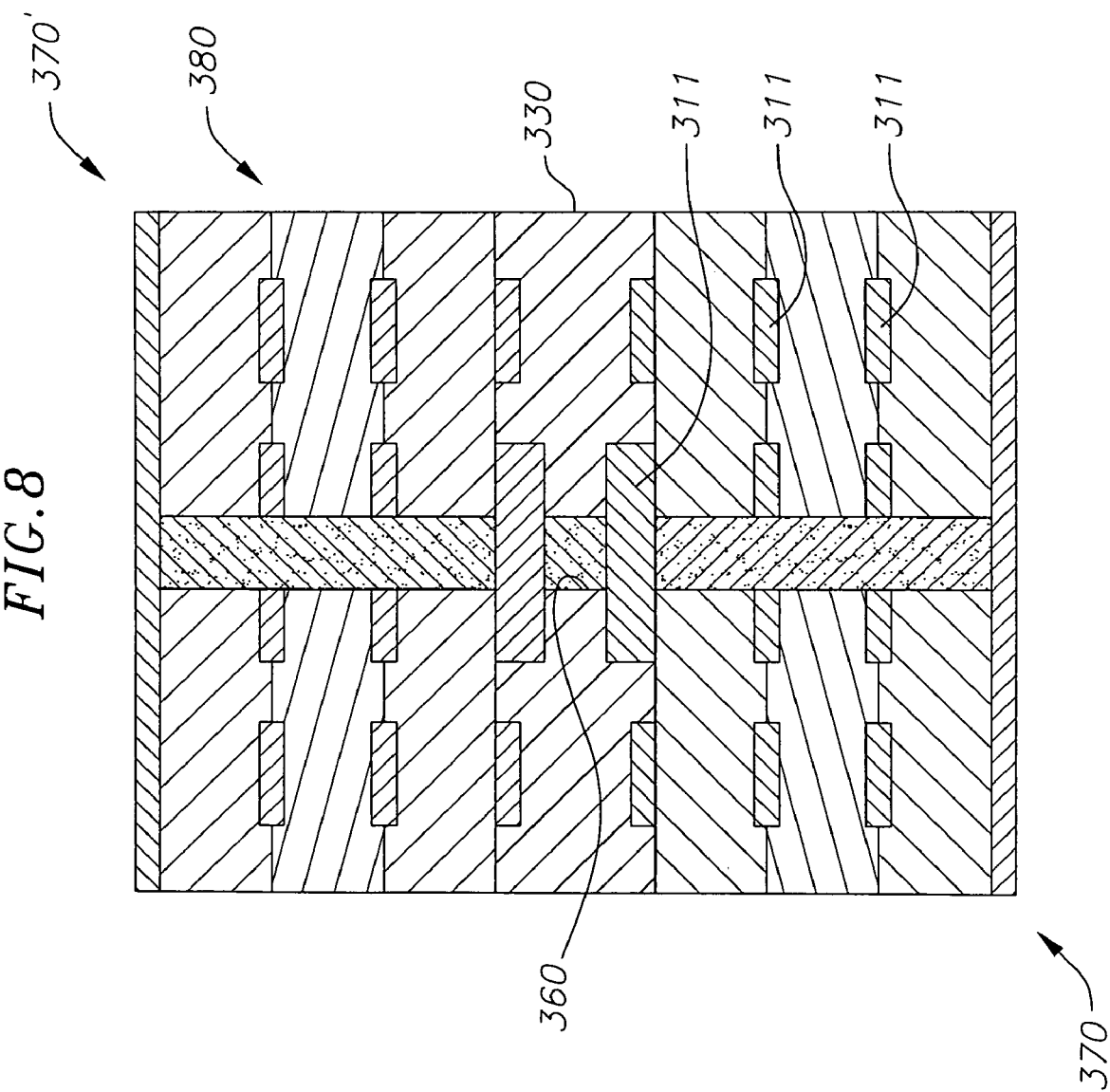
FIG. 8 shows a cross-sectional view of an embodiment of a printed circuit board manufactured by the method shown in FIGS. 7a-7d.

FIG. 8 is a cross-sectional view showing an embodiment of a printed circuit board 380 manufactured by the method shown in FIGS. 7a-7d. The same reference numbers are used in FIG. 8 to refer to the same or like parts shown in FIGS. 7a-7d.

The printed circuit board 380 shown in FIG. 8 includes a plurality of circuit layers (e.g., eight circuit layers). Here, the conductive paste 360 electrically interconnects at least one of a plurality of copper foil pads (e.g., three copper foil pads) 311 located on a side of a four-layer substrate 370 to at least one of a plurality copper foil pads (e.g., three copper foil pads) 311 located on a side of a second four-layer substrate 370'.

As such and in view of the above, a printed circuit board with Z-axis interconnect(s) or micro via(s) is provided that can eliminate a need for plating micro vias and/or eliminate a need for planarizing plated bumps of a surface, that can be fabricated with one or two lamination cycles, and/or that can have carrier-to-carrier (or substrate-to-substrate) attachments with conductive vias, each filled with a conductive material (e.g., with a conductive paste) in the Z-axis.

While the invention has been described in connection with certain exemplary embodiments, it is to be understood by those skilled in the art that the invention is not limited to the disclosed embodiments, but, on the contrary, is intended to cover various modifications included within the spirit and scope of the present invention, appended exhibit, and equivalents thereof. For example, one or more prepregs to the stack can be used to supplement the adhesive films described above, particularly on the outer layer. In addition, circuits can be built additively on stainless steel carriers and laminated to prepregs to make the single sided cores. This creates a very flat and precise geometry impedance controllable circuit. The conductive ink for some layers can be replaced with an inductive ink (e.g., containing ferrite) to allow building R/C filters for EMF protection (in, e.g., automotive, aeronautics, etc.). Also, certain embodiments of the present invention can use resistive foils, or capacitive layers; can allow cavities within the board adjacent to conductors requiring high speed signals, transmission lines (air as a dielectric); can perform the same function as is accomplished by backdrilling for higher speed applications such as servers; can use polyimide (or other film) bond ply instead of free film adhesive; can use mixtures of films and composite materials to make rigid and/or flex constructions; and/or can pre-rout or -punch individual cores to allow bendable interconnects without connectors.

What is claimed is:

1. A method of manufacturing a printed circuit board having a plurality of circuit layers with at least one z-axis interconnect using a single lamination cycle, the method comprising:
   attaching a plurality of one-metal layer carriers with each other after parallel processing each of the plurality of one-metal layer carriers, wherein the parallel processing of at least one of the plurality of one-metal layer carriers comprises:
      imaging at least one photo resist onto a substrate having at least one copper foil formed on at least one side of the substrate;
      etching off the at least one copper foil from the substrate with exception of at least one part of the at least one copper foil covered by the at least one photo resist;
      stripping off the at least one photo resist to expose the at least one part of the at least one copper foil to form at least one copper foil pad for one of the plurality of circuit layers;
      applying a lamination adhesive on the substrate;
      applying a protective film on the lamination adhesive;
      forming at least one micro via into the substrate to expose the at least one copper foil pad at a side of the substrate opposite to the at least one side of the substrate;
      filling at least one conductive paste into the at least one micro via formed in the substrate; and
      removing the protective film to expose the lamination adhesive on the substrate for attachment.

2. The method of claim 1, wherein the attaching of the plurality of one-metal layer carriers comprises:
   aligning the plurality of one-metal layer carriers adjacent to each other; and
   curing the lamination adhesive on the substrate of each the plurality of one-metal layer carriers to laminate the plurality of one-metal layer carriers with each other.

3. The method of claim 2, wherein the laminated one-metal layer carriers comprise a first side on which the one of the plurality of circuit layers is disposed, and a second side opposite to the first side.

4. The method of claim 3, further comprising:
   disposing a second one of the plurality of circuit layers on the second side of the laminated one-metal layer carriers to complete a formation of the printed circuit board.

5. The method of claim 4, wherein a third one of the plurality of circuit layers is disposed between the one of the plurality of circuit layers and the second one of the plurality of circuit layers.

6. The method of claim 1, wherein the plurality of circuit layers of the printed circuit board manufactured using the single lamination cycle comprises at least four circuit layers.

7. The method of claim 1, wherein the plurality of circuit layers of the printed circuit board manufactured using the single lamination cycle comprises at least five circuit layers.

8. The method of claim 1, wherein the plurality of circuit layers of the printed circuit board manufactured using the single lamination cycle comprises at least six circuit layers.

9. The method of claim 1, wherein the plurality of circuit layers of the printed circuit board manufactured using the single lamination cycle comprises at least seven circuit layers.

10. The method of claim 9, wherein the polyester film is Mylar.

11. The method of claim 1, wherein the substrate comprises a core material selected from the group consisting of metal, ceramic, FR4, GPY, and combinations thereof.

12. The method of claim 1, wherein the protective film comprises a material selected from the group consisting of polyester, oriented polypropylene, polyvinylfluoride, polyethylene, high density polyethylene, polyethylene napthalate, pacothane, polymethylpentene, and combinations thereof.

13. The method of claim 1, wherein the plurality of circuit layers of the printed circuit board manufactured using the single lamination cycle comprises at least eight circuit layers.

14. The method of claim 1, wherein the at least one micro via is formed by laser drilling.

15. The method of claim 1, wherein the at least one micro via is formed by mechanical drilling.

16. The method of claim 1, wherein the at least one photo resist is imaged by laser-direct-imaging.

17. The method of claim 1, wherein the at least one photo resist is imaged by photo imaging, silkscreen imaging, offset imaging, and/or inkjet imaging.

18. The method of claim 1, wherein the parallel processing of at least another one of the plurality of one-metal layer carriers comprises:
   imaging at least one photo resist onto a metal plate having at least one copper flash formed on at least one side of the metal plate to develop at least one cavity;
   plating copper into the at least one cavity;
   stripping off the at least one photo resist to form at least one copper foil pad for one of the plurality of circuit layers;
   applying prepreg on the at least one copper foil pad to laminate the prepreg with the metal plate;
   curing the prepreg laminated with the metal plate with the at least one copper foil pad and the at least one copper flash therebetween;
   peeling the at least one copper foil pad and the at least one copper flash with the cured prepreg from the metal plate; and
   etching off the at least one copper flash to expose the at least one copper foil pad on the cured prepreg.

19. The method of claim 18, wherein the parallel processing of the at least another one of the plurality of one-metal layer carriers further comprises:

forming at least one micro via into the cured prepreg to expose the at least one copper foil pad at opposite sides of the cured prepreg; and filling at least one conductive paste into the at least one micro via formed in the cured prepreg.

20. The method of claim 1, wherein the plurality of circuit layers of the printed circuit comprises an odd number of circuit layers.

21. A method of manufacturing a printed circuit board having a plurality of circuit layers with at least one z-axis interconnect using a single lamination cycle, the method comprising:

attaching a plurality of one-metal layer carriers with each other after parallel processing each of the plurality of one-metal layer carriers, wherein the parallel processing of at least one of the plurality of one-metal layer carriers comprises:

imaging at least one photo resist onto a metal plate having at least one copper flash formed on at least one side of the metal plate to develop at least one cavity;

plating copper into the at least one cavity;

stripping off the at least one photo resist to form at least one copper foil pad for one of the plurality of circuit layers;

applying a first side of a prepreg on the at least one copper foil pad to laminate the prepreg with the metal plate;

curing the prepreg laminated with the metal plate with the at least one copper foil pad and the at least one copper flash therebetween;

peeling the at least one copper foil pad and the at least one copper flash with the cured prepreg from the metal plate;

etching off the at least one copper flash to expose the at least one copper foil pad on the cured prepreg;

applying a lamination adhesive on the cured prepreg;

applying a protective film on the lamination adhesive;

forming at least one micro via into the cured prepreg to expose the at least one copper foil pad at a second side of the cured prepreg opposite to the first side of the cured prepreg;

filling at least one conductive paste into the at least one micro via formed in the cured prepreg; and removing the protective film to expose the lamination adhesive on the cured prepreg for attachment.

* * * * *

UNITED STATES PATENT AND TRADEMARK OFFICE
CERTIFICATE OF CORRECTION

| | | |
|---|---|---|
| PATENT NO. | : 7,523,545 B2 | Page 1 of 2 |
| APPLICATION NO. | : 11/706473 | |
| DATED | : April 28, 2009 | |
| INVENTOR(S) | : Raj Kumar et al. | |

It is certified that error appears in the above-identified patent and that said Letters Patent is hereby corrected as shown below:

In the drawings, Fig 5i should be replaced with the corrected Fig 5i as shown on the attached page.

Column 13, line 65, Claim 2

After "each"
Insert -- of --

Signed and Sealed this
Twenty-ninth Day of May, 2012

David J. Kappos
*Director of the United States Patent and Trademark Office*